(12) United States Patent  
Usami

(10) Patent No.: US 7,148,571 B1  
(45) Date of Patent: Dec. 12, 2006

(54) SEMICONDUCTOR DEVICE AND METHOD OF MANUFACTURING THE SAME

(75) Inventor: Tatsuya Usami, Tokyo (JP)

(73) Assignee: NEC Electronics Corporation, Kanagawa (JP)

(*) Notice: Subject to any disclaimer, the term of this patent is extended or adjusted under 35 U.S.C. 154(b) by 0 days.

(21) Appl. No.: 09/627,418

(22) Filed: Jul. 27, 2000

(30) Foreign Application Priority Data

Jul. 30, 1999 (JP) .................................. 11-217085

(51) Int. Cl.
*H01L 23/48* (2006.01)

(52) U.S. Cl. ............ 257/758; 257/759; 257/760; 257/762

(58) Field of Classification Search ........ 257/758–760, 257/762, 763
See application file for complete search history.

(56) References Cited

U.S. PATENT DOCUMENTS

| | | | | |
|---|---|---|---|---|
| 5,969,422 | A * | 10/1999 | Ting et al. ................. | 257/762 |
| 6,037,664 | A * | 3/2000 | Zhao et al. ................. | 257/758 |
| 6,096,648 | A * | 8/2000 | Lopatin et al. ............. | 438/687 |
| 6,111,301 | A * | 8/2000 | Stamper ..................... | 257/529 |
| 6,121,150 | A * | 9/2000 | Avanzino et al. .......... | 438/692 |
| 6,127,089 | A * | 10/2000 | Subramanian et al. .... | 430/270 |
| 6,242,808 | B1 * | 6/2001 | Shimizu et al. ............ | 257/762 |
| 6,265,779 | B1 * | 7/2001 | Grill et al. ................. | 257/759 |
| 6,323,142 | B1 * | 11/2001 | Yamazaki et al. ......... | 438/790 |
| 6,423,651 | B1 * | 7/2002 | Nakano et al. ............. | 438/782 |
| 6,566,756 | B1 * | 5/2003 | Morisaki et al. ........... | 257/758 |
| 6,624,061 | B1 * | 9/2003 | Aoki ........................... | 438/622 |

FOREIGN PATENT DOCUMENTS

| | | |
|---|---|---|
| JP | 4-134827 | 5/1992 |
| JP | 10-256252 | 9/1998 |
| JP | 11-186261 | 7/1999 |
| JP | 11-186274 | 7/1999 |
| JP | 11-191676 | 7/1999 |
| JP | 11-330075 | 11/1999 |
| JP | 2000-243749 | 9/2000 |

OTHER PUBLICATIONS

Japanese Office Action dated Feb. 26, 2002, with partial translation.
Korean Office Action dated May 17, 2002, with partial Japanese and English translation.

* cited by examiner

*Primary Examiner*—T. N. Quach
(74) *Attorney, Agent, or Firm*—McGinn IP Law Group, PLLC

(57) ABSTRACT

Provided is a semiconductor device comprising: an HSQ layer formed on a Cu wiring line and having properties that Cu is unlikely to enter the HSQ layer; a plug formed in the HSQ layer and connected to the Cu wiring line; and a Cu wiring line inserted inside the HSQ layer and connected to the plug. A W layer which allows the plug and the HSQ layer to adhere to each other is formed between the plug and the HSQ layer, and another W layer which allows the Cu wiring line and the HSQ layer to adhere to each other and which is formed of tungsten is formed between the Cu wiring line and the HSQ layer.

24 Claims, 20 Drawing Sheets

SEMICONDUCTOR DEVICE AND METHOD OF MANUFACTURING THE SAME

BACKGROUND OF THE INVENTION

1. Field of the Invention

The present invention relates to a semiconductor device having a wiring line which is formed of Cu, and method of manufacturing the same.

2. Description of the Related Art

The more the structure of semiconductor devices becomes complicated, the more the structure of a wiring line included in the devices becomes sophisticated as well. Particularly, the multi-layer structure of a wiring line has become commonly used. In recent years, in order to lower the resistance of a wiring line and to increase the operational speed of devices, semiconductor devices, wherein wiring lines and plugs are formed of Cu and interlayer insulating films are formed of low-permittivity layers (Low-k layers), have been developed.

Cu is likely to enter the interlayer insulating films. Once Cu is diffused, a leakage current occurs between adjacent wiring lines. Hence, a layer what is so-called a barrier metal preventing the diffusion of Cu needs to be formed between the wiring line, the plug and the interlayer insulating films.

FIG. 9 is a cross section showing the structure of a semiconductor device having the barrier metal. The barrier metal included in this semiconductor device is formed of TaN, whereas interlayer insulating films are formed of organic polymer having low permittivity.

As described in FIG. 9, an SiN layer 22, an organic polymer layer 23, an SiN layer 27, an SiN layer 28, an organic polymer layer 29 and an SiN layer 33 are formed on a Cu wiring line 21 sequentially in this order.

A TaN layer 24 is formed on the inner surface of a via hole formed throughout the SiN layer 22, the organic polymer layer 23 and the SiN layer 27.

A seed layer 25 is formed over the TaN layer 24. The seed layer 25 is formed of Cu, and is a layer which serves as nuclei of crystallization for a plated layer 26 to grow, when to form the plated layer 26 with a plating.

The plated layer 26 is formed on the seed layer 25, so that the inside of the seed layer 25 is filled therewith. The plated layer 26 is formed of Cu, and serves as a plug together with the seed layer 25.

A TaN layer 30 is formed on the inner surface of an opening which is formed throughout the SiN layer 28, the organic polymer layer 29 and the SiN layer 33.

A seed layer 31 is formed above the TaN layer 30. The seed layer 31 is formed of Cu, and is a layer which serves as nuclei of crystallization for a plated layer 32 to grow, when to form the plated layer 32 with a plating.

The plated layer 32 is formed on the seed layer 31, so that the inside of the seed layer 31 is filled with the plated layer 32. The plated layer 32 is formed of Cu, and serves as a Cu wiring line together with the seed layer 31. This Cu wiring line is connected to a Cu wiring line 21 via the plug composed of the seed layer 25 and the plated layer 26.

FIGS. 10A to 10H are cross sections each showing a process for manufacturing the semiconductor device described in FIG. 9.

As illustrated in FIG. 10A, the SiN layer 22 which is 50 nm in thickness is formed on the Cu wiring line 21 with a CVD (Chemical Vapor Deposition) technique.

Then, for example, PAE (Poly Arylene Ether) as organic polymer is applied to the SiN layer 22 to a thickness of approximately 400 nm, and baked thereon. By doing this, as described in FIG. 10A, the organic polymer layer 23 is formed on the SiN layer 22.

As described in FIG. 10A, the SiN layer 27 which is 100 nm in thickness is formed on the organic polymer layer 23 with the CVD technique.

A photoresist 34 is formed on the SiN layer 27, and patterned as described in FIG. 10B.

Then, the SiN layer 27 is etched while using the photoresist 34 as a mask, as shown in FIG. 10C.

After this, as described in FIG. 10D, the photoresist 34 and the organic polymer layer 23 are etched with an $O_2$ plasma etching process.

The SiN layers 22 and 27 are etched with an RF etching process, etc., thereby to form a via hole. As described in FIG. 10E, the TaN layer 24 which is 20 nm in thickness is formed on the inner surface of the via hole and on the surface of the SiN layer 27 with an ionization sputtering technique.

Then, as illustrated in FIG. 10F, the seed layer 25 which is 100 nm in thickness is formed over the TaN layer 24 with a sputtering technique.

As shown in FIG. 10G, the plated layer 26 which is 800 nm in thickness is formed over the seed layer 25 while being plated, so that the inside of the seed layer 25 is filled with the plated layer 26.

After this, as illustrated in FIG. 10H, the TaN layer 24, the seed layer 25 and the plated layer 26 are so polished as to expose the surface of the SiN layer 27 with a CMP (Chemical Mechanical Polishing) technique. By doing this, the plug composed of the seed layer 25 and the plated layer 26 can be formed.

Similarly to the above, after the SiN layer 28, the organic polymer layer 29 and the SiN layer 33 are formed, an opening is formed throughout the SiN layer 28, the organic polymer 29 and the SiN layer 33. The TaN layer 30, the seed layer 31 and the plated layer 32 are formed inside the opening, then the semiconductor device shown in FIG. 9 is finally completed.

Since the organic polymer layers 23 and 29 can not prevent the diffusion (penetration) of Cu, the TaN layers 24 and 30 are formed as a barrier metal.

In order to reliably prevent Cu from entering the organic polymer layers 23 and 29, the TaN layers 24 and 30 need to be formed thick (particularly to a thickness of 50 nm or more). Thus, the wiring line is hardly made small in size.

Besides, there is a large difference between the etching rate of TaN and that of Cu. Under such circumstances, if a CMP technique is applied both to the TaN layer 24 and the Cu layer (the seed layer 25 and the plated lay 26), dishing, recess or the like is likely to be formed in the Cu layer, as illustrated in FIG. 10H.

In the case of etching the SiN layers 22 or 28, Cu is attached to the inner wall of the via hole or the opening, as described in FIG. 11, and Cu may enter the organic polymer layers 23 or 29.

In a case where the plug and the Cu wiring line are formed in a dual damascene process, an aspect ratio of a hole, which has been formed to be filled with Cu, is high. Hence, a barrier metal to be formed on the periphery of the bottom of the hole may become quite thin, as described in FIG. 12.

In a case where the position in which the hole to be formed deviates from its appropriate position, another hole may be created in the interlayer insulating film which is adjacent to the lower wiring line, as illustrated in FIG. 12. The created hole is very narrow. Thus, on the periphery of the bottom of the hole, the barrier metal may be formed very thin or may not be formed.

Accordingly, if the barrier metal is formed very thin or is not formed, Cu is likely to be diffused, and a leakage current is likely to occur. As a result of the above, the semiconductor device may not properly operate.

SUMMARY OF THE INVENTION

It is accordingly an object of the present invention to provide a semiconductor device which operates properly and a method of manufacturing the same.

Another object thereof is to provide a semiconductor device, wherein diffusion of Cu is prevented, and a method of manufacturing the same.

In order to accomplish the above objects, according to the first aspect of the present invention, there is provided a semiconductor device comprising:

a plurality of wiring lines which are formed of Cu whose concentration is equal to or higher than $10^{19}$ atoms/cm$^3$; and an insulating layer which has a property that Cu is unlikely to enter the insulating layer and which insulates between the plurality of wiring lines.

According to this invention, the diffusion of Cu is prevented by the insulating layer, thus there is almost no possibility that the semiconductor device inappropriately operates under the influence of the diffusion of Cu.

The insulating layer may include an HSQ layer which is formed of HSQ (Hydrogen Silsesquioxane).

The semiconductor device may further comprise adhesion layers, which are formed respectively between one of the plurality of wiring lines and the insulating layer and between one of the plurality of wiring lines and the insulating layer, and which allow the plurality of wiring lines and the insulating layer to adhere to one another through the adhesion layers.

The adhesion layer may have an etching rate which is equivalent to an etching rate of the plurality of wiring lines.

The adhesion layer may be formed of tungsten.

According to the second aspect of the present invention, there is provided a method of manufacturing a semiconductor device, comprising:

forming, on a first wiring line formed of Cu, a first insulating layer having a property that Cu is unlikely to enter the first insulating layer;

forming a first hole in the first insulating layer, and filling the first hole with Cu, thereby to form a plug connected to the first wiring line;

forming, on the first insulating layer, a second insulating layer having a property that Cu is unlikely to enter the second insulating layer; and forming a second hole in the second insulating layer, and filling the second hole with Cu, thereby to form a second wiring line connected to the plug.

The forming the first insulating layer may include forming the first insulating layer using HSQ (Hydrogen Silsesquioxane); and the forming the second insulating layer may include forming the second insulating layer using HSQ.

The forming the plug may include:

forming, on an inner surface of the first hole, an adhesion layer which allows the first insulating layer and the plug to adhere to each other; and filling an inside of the adhesion layer with Cu.

The forming the second wiring line may include:

forming, on an inner surface of the second hole, an adhesion layer which allows the second insulating layer and the second wiring line to adhere to each other; and filling an inside of the adhesion layer with Cu.

The forming the adhesion layer may include forming the adhesion layer using a material having an etching rate which is equivalent to an etching rate of Cu.

The forming the adhesion layer may include forming the adhesion layer using tungsten.

BRIEF DESCRIPTION OF THE DRAWINGS

These objects and other objects and advantages of the present invention will become more apparent upon reading of the following detailed description and the accompanying drawings in which.

DETAILED DESCRIPTION OF THE PREFERRED EMBODIMENT

A semiconductor device according to the first embodiment of the present invention will now be described with reference to the accompanying drawings.

Figure 1:
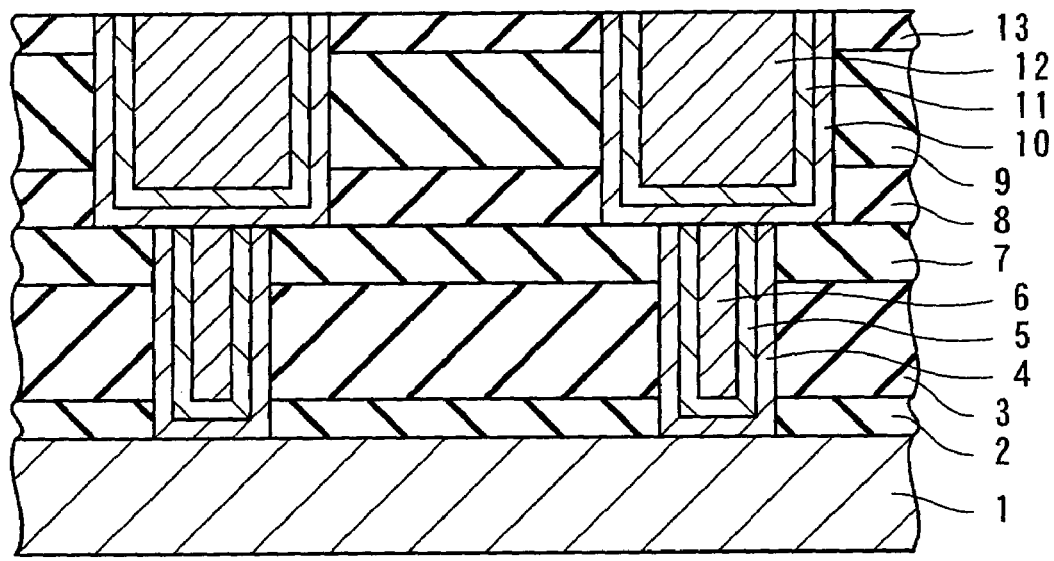
FIG. 1 is a cross section showing the structure of a semiconductor device according to the first embodiment.

FIG. 1 is a cross section of the semiconductor device according to the first embodiment.

As described in FIG. 1, the semiconductor device comprises a Cu wiring line 1, a SiN layer 2, an HSQ (Hydrogen Silsesquixane) layer 3, a tungsten layer (W layer) 4, a seed layer 5, a plated layer 6, a SiN layer 7, a SiN layer 8, an HSQ layer 9, a W layer 10, a seed layer 11, a plated layer 12 and a SiN layer 13.

The SiN layer 2, the HSQ layer 3, the SiN layer 7, the SiN layer 8, the HSQ layer 9 and the SiN layer 13 are formed on the Cu wiring line 1 sequentially in this order.

The SiN layer 2 and the SiN layer 7 are both interlayer insulating films formed in order to offset the strength of the HSQ layer 3 which is formed between the two. The SiN layer 8 and the SiN layer 13 are both interlayer insulating films formed in order to offset the strength of the HSQ layer 9 which is formed between the two.

The HSQ layers 3 and 9 are both interlayer insulating films which have low permittivity (particularly, approximately 3) and properties that Cu is unlikely to enter the films.

The W layer 4 is formed on the inner surface of a via hole which is formed through the SiN layer 2, the HSQ layer 3 and the SiN layer 7, so that the HSQ layer 3 and the seed layer 5 adhere to each other therethrough.

The seed layer 5 is formed over the W layer 4. The seed layer 5 is formed of Cu, and is a layer which servers as nuclei of crystallization for the plated layer 6 to grow, when to form the plated layer 6 with a plating.

The plated layer 6 is formed on the seed layer 5 so that the inside of the seed layer 5 is filled with the plated layer 6. The plated layer 6 is formed of Cu, and serves as a plug together with the seed layer 5.

The W layer 10 is formed on the inner surface of the opening which is formed throughout the SiN layer 8, the HSQ layer 9 and the SiN layer 13, and allows the HSQ layer 9 and the seed layer 11 to adhere to each other therethrough.

The seed layer 11 is formed over the W layer 10. The seed layer 11 is formed of Cu, and is a layer which servers as nuclei of crystallization for the plated layer 12 to grow, when to form the plated layer 12 with a plating.

The plated layer 12 is formed on the seed layer 11 so as to fill the inside of the seed layer 11. The plated layer 12 is formed of Cu, and servers as a Cu wiring line together with the seed layer 11. This Cu wiring line is an upper-layer wiring line, and connected to the Cu wiring line 1 serving as a lower-layer wiring line, via the plug which is composed of the seed layer 5 and the plated layer 6. The minimum interval between the adjacent Cu wiring lines is approximately 0.2 to 0.3 μm.

Accordingly, since the HSQ layers 3 and 9, having the properties that Cu is unlikely to enter there, are employed as interlayer insulating films, diffusion of Cu atoms forming the plug (the seed layer 5 and the plated layer 6) and the Cu wiring line (the seed layer 11 and the plated layer 12) can be prevented.

Explanations will now be made to HSQ having properties of preventing diffusion of Cu.

Figure 2A:
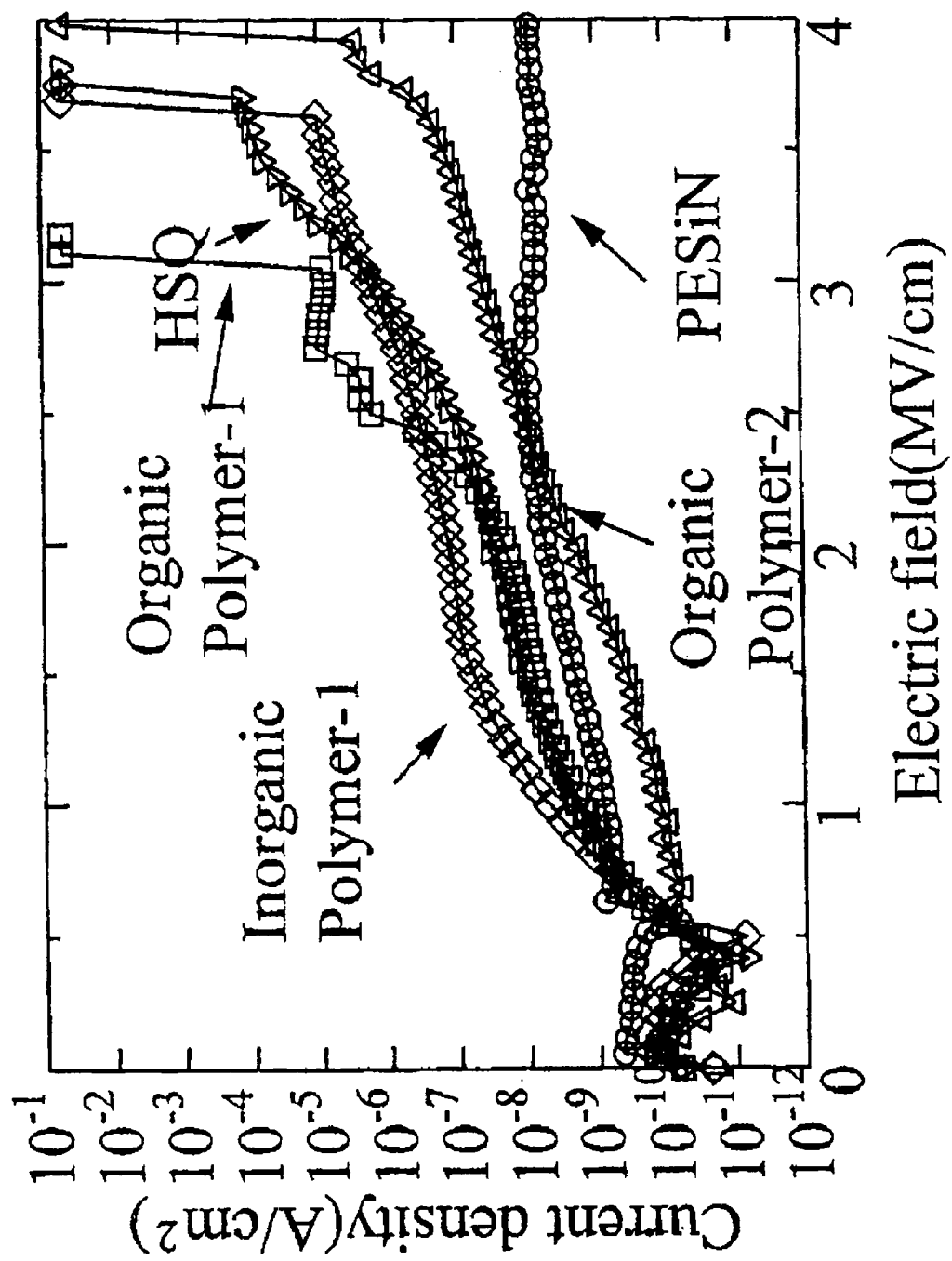
FIG. 2A is a diagram showing the voltage-leakage current characteristics of a low permittivity layer which is not heat-treated.
Figures 2B, 2C:
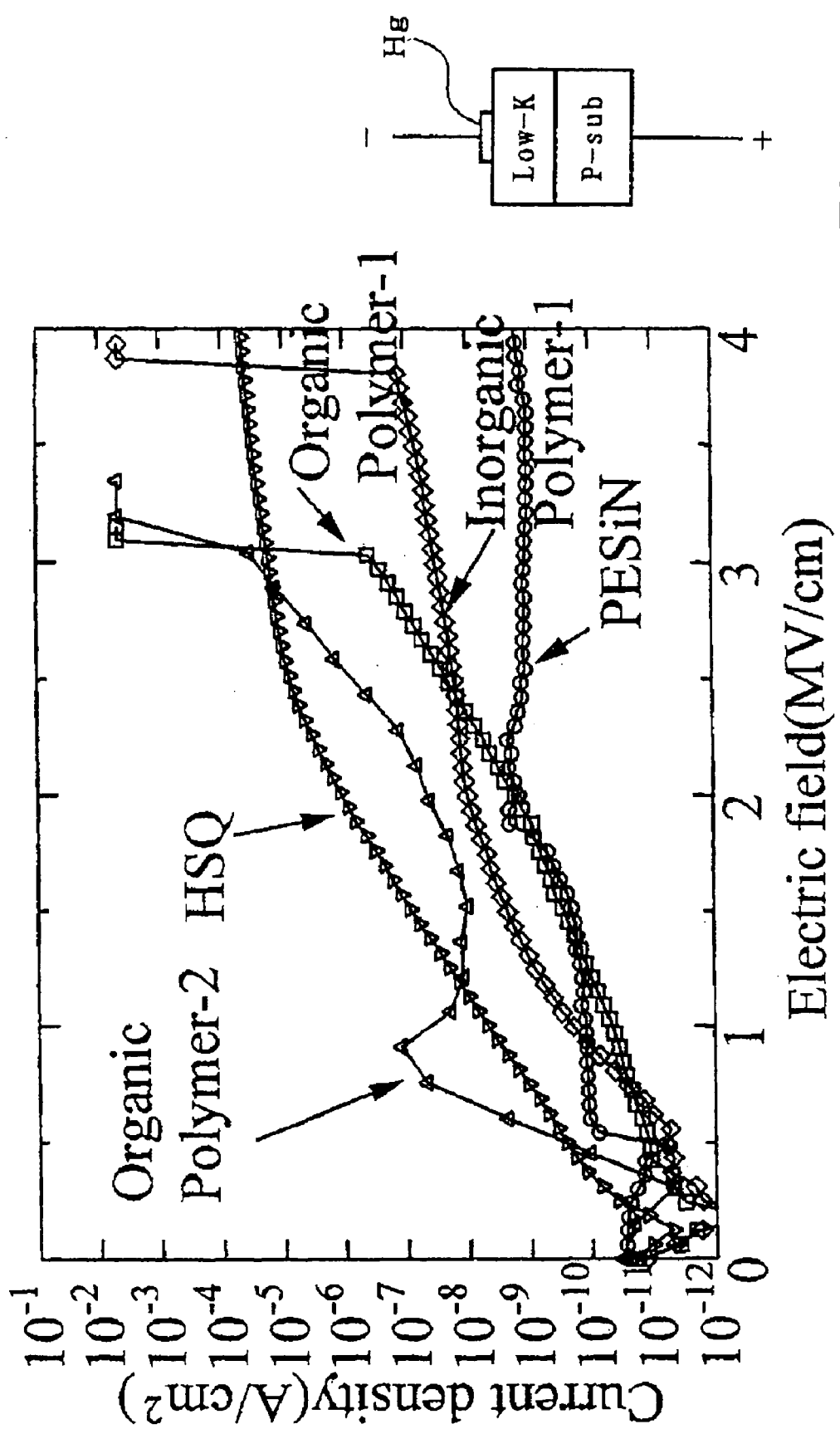
FIG. 2B is a diagram showing the voltage-leakage current characteristics of a low permittivity layer which is heat-treated.
FIG. 2C is a structural diagram of a device which is in use for measuring the voltage-leakage current characteristics described in FIGS. 2A and 2B.

FIGS. 2A and 2B each illustrates voltage-leakage current characteristics of a low permittivity layer (Low-k layer) comprising HSQ, two types of Organic Polymer (Organic Polymer-1, Organic Polymer-2) and one type of Inorganic Polymer (Inorganic Polymer-1). FIG. 2A illustrates the characteristics of the low permittivity layer in a device, described in FIG. 2C, which is not heat-treated. FIG. 2B illustrates the characteristics of the low permittivity layer in the device to which heat treatment (400° C., 7 hours) to be actually performed during a process for manufacturing a semiconductor device is performed. Particularly, the low permittivity layer is sandwiched between a P-type silicon substrate and an Hg electrode, as described in FIG. 2C. Such voltage-leakage current characteristics are obtained by measuring a current which flows upon applying a predetermined electric field between the P-type silicon substrate and the Hg electrode of the above device. For the sake of comparison, FIGS. 2A and 2B each illustrates the voltage-leakage current characteristics of a low permittivity layer formed of SiN (in the illustration, denoted by PESiN).

As described in FIGS. 2A and 2B, the leak current of the Organic Polymer-2 dramatically varies before and after the heat treatment. In more particular, the leakage current of the Organic Polymer-2 increases at the highest rate than any other leakage currents, after the heat treatment is performed.

The tendency that the leakage current is likely to flow by carrying out the heat treatment means that Cu, etc. is likely to enter the low permittivity layer by carrying out the heat treatment. In other words, whether Cu is likely to be diffused is indicated on the basis of whether the leak current incredibly varies before and after the heat treatment. Thus, based on the results described in FIGS. 2A and 2B, it is indicated that the Organic Polymeter-2 can not prevent the diffusion of Cu.

Figure 3A:
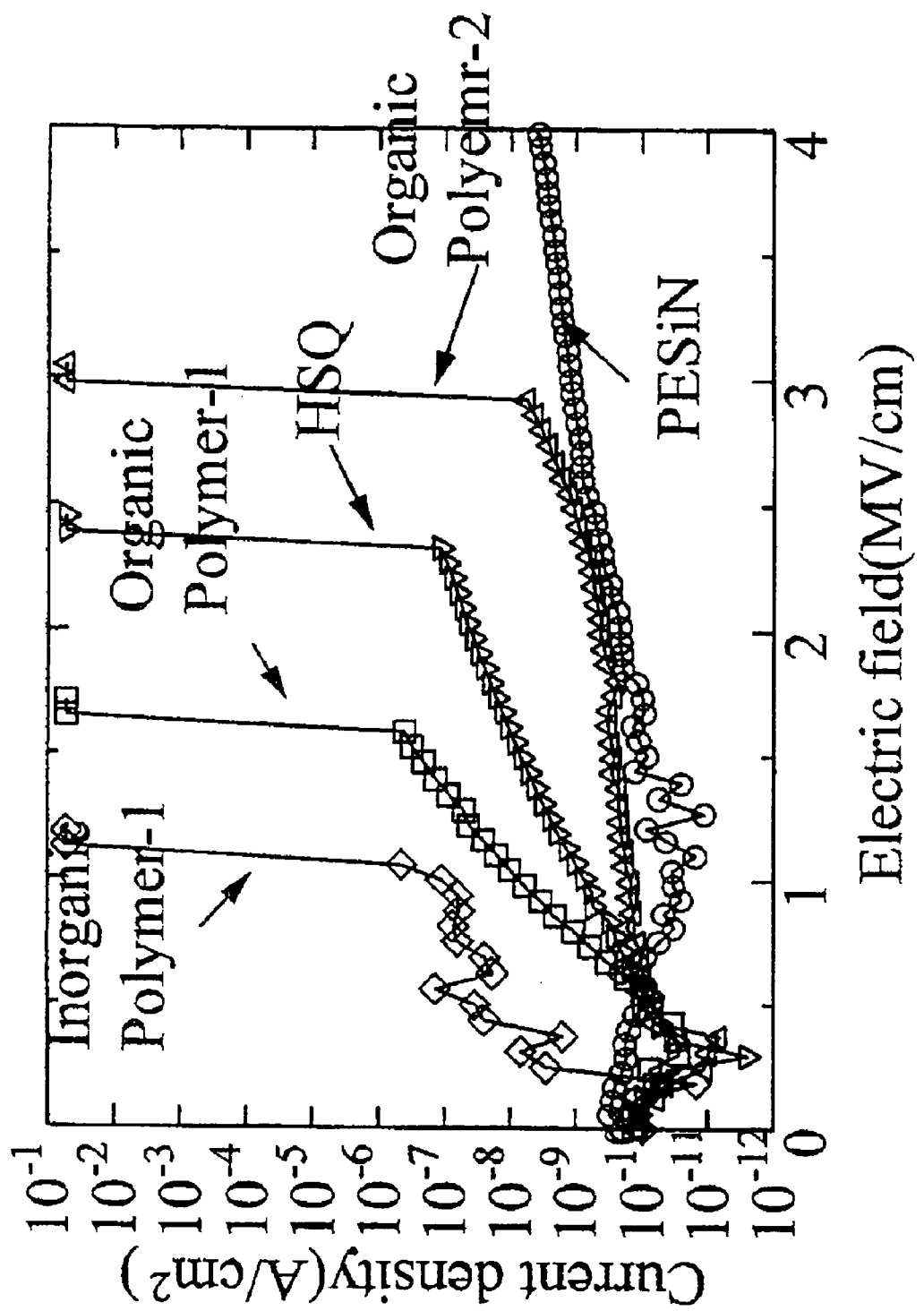
FIG. 3A is a diagram showing the voltage-leakage current characteristics of a low permittivity layer which is not heat-treated.
Figure 3B:
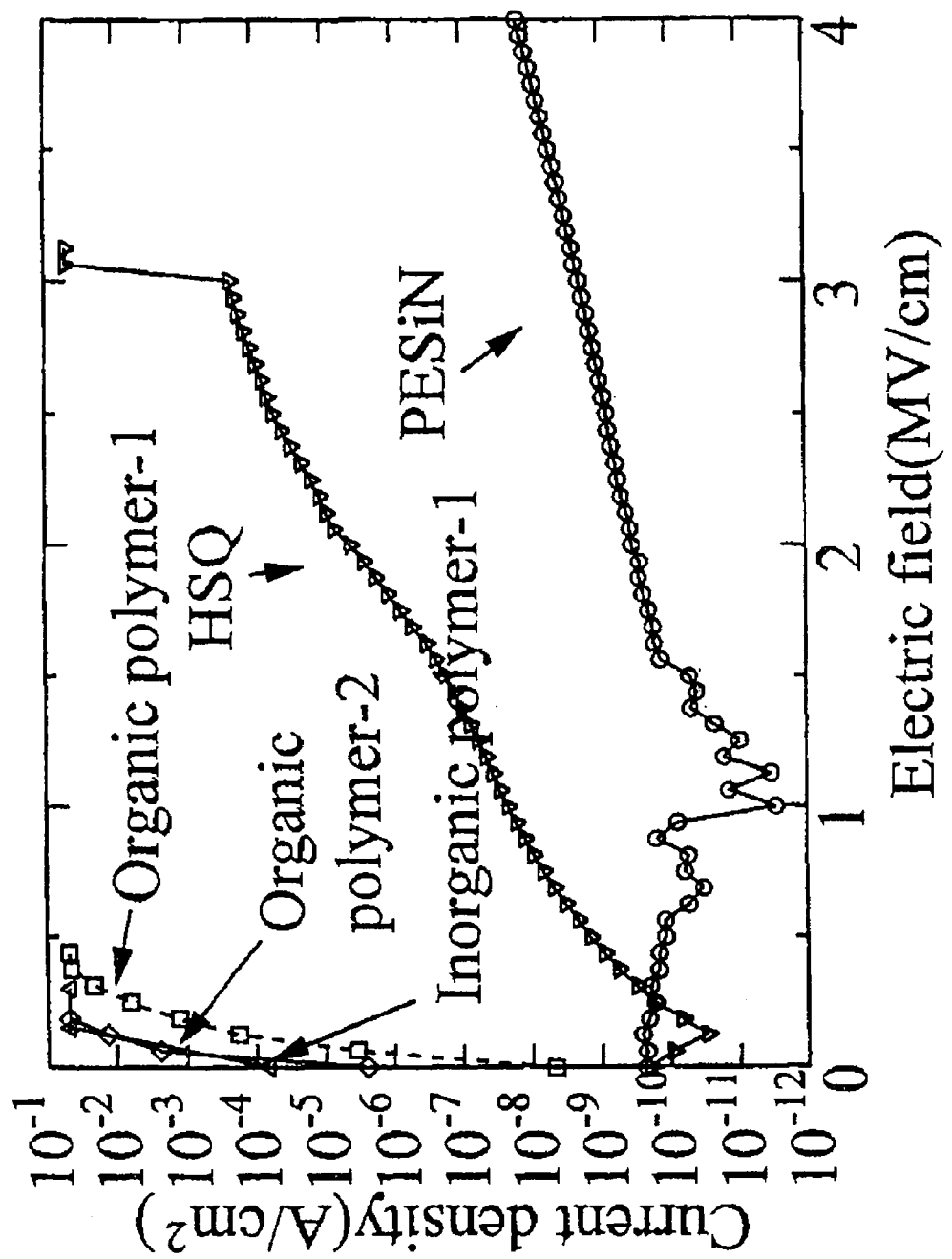
FIG. 3B is a diagram showing the voltage-leakage current characteristics of a low permittivity layer which is heat-treated.
Figure 3C:
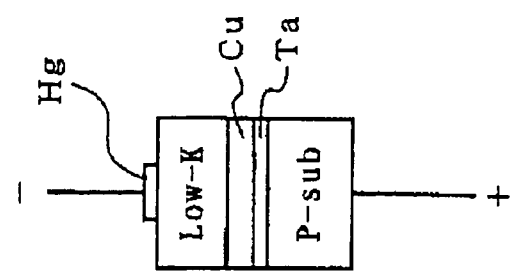
FIG. 3C is a structural diagram showing a device which is in use for measuring the voltage-leakage current characteristics described in FIGS. 3A and 3B.

FIGS. 3A and 3B each illustrates the voltage-leakage current characteristics of a low permittivity layer which are obtained by the measurement performed in the same manner as those described in FIGS. 2A and 2B. In particular, FIG. 3A shows such characteristics of a low permittivity layer in a device which is not heat-treated. FIG. 3B shows the characteristics of the layer in the device to which heat treatment (400° C., 7 hours) to be actually performed during a process of manufacturing semiconductor devices is performed. The device employed for the measurement is composed of, as illustrated in FIG. 3C, a barrier metal formed of Ta, a Cu layer, a low permittivity layer and an Hg electrode all of which are stacked on top of each other in this order on a P-type silicon substrate. For the sake of comparison, FIGS. 3A and 3B each illustrates the voltage-leakage current characteristics of a low permittivity layer formed of SiN (in the illustration, denoted by PESiN).

As illustrated in FIGS. 3A and 3B, the leakage currents of the respective Organic Polymer-1, the Organic Polymer-2 and the Inorganic Polymer-1 dramatically vary, before and after the heat treatment. In consideration of this, it is indicated that the Organic Polymer-1, the Organic Polymer-2 and the Inorganic Poymer-1 can not prevent the diffusion of Cu.

On the other hand, in terms of HSQ, as compared to any other compounds, the leakage current only slightly varies before and after the heat treatment, i.e., it is suggested that HSQ can effectively prevent the diffusion of Cu.

Figure 4:
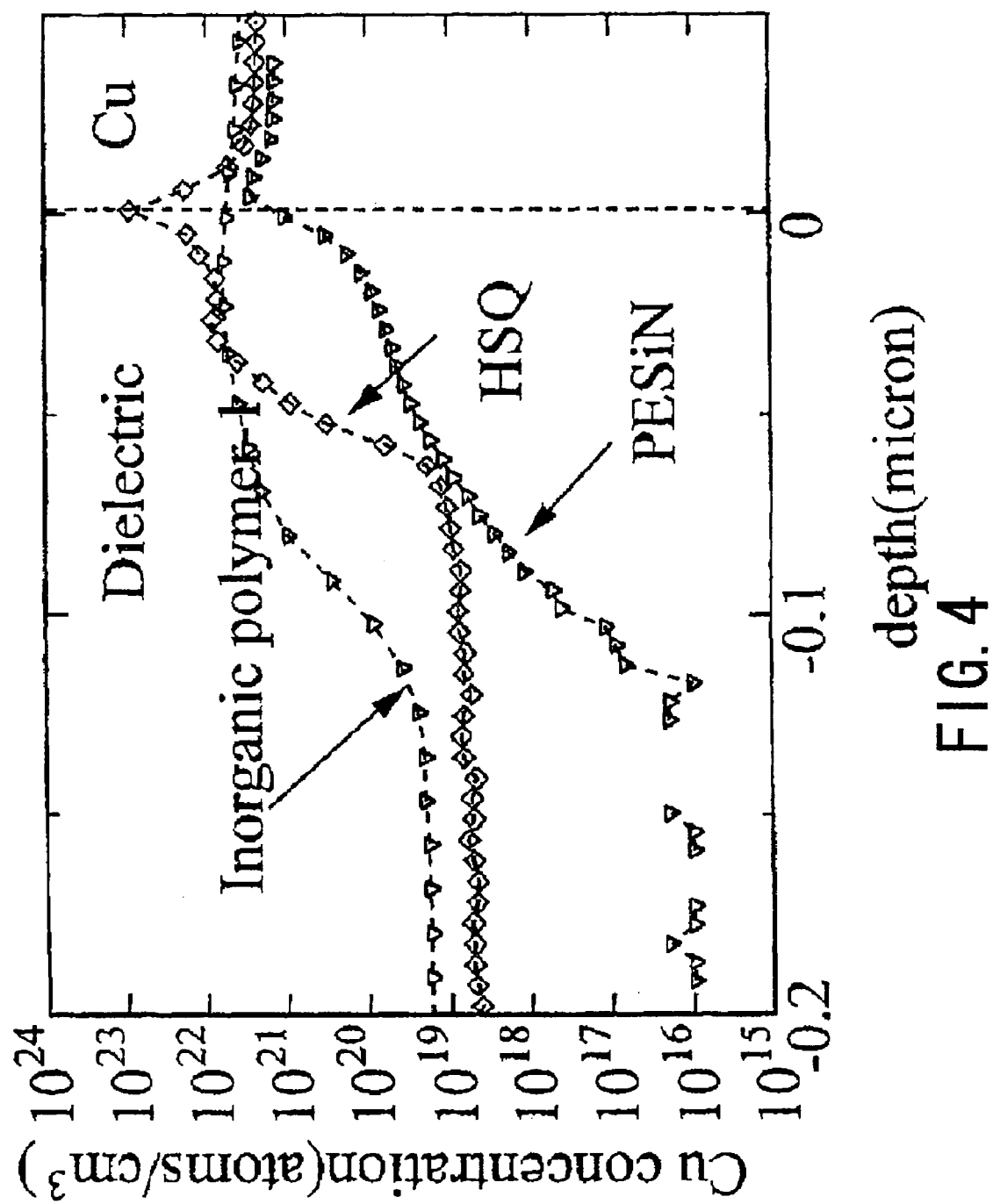
FIG. 4 is a diagram showing the concentration of Cu in each low permittivity layer after being heat-treated.

FIG. 4 illustrates the Cu concentration inside a low permittivity layer which concentration is measured using SIMS (Secondary Ion Mass Spectroscopy). Particularly, FIG. 4 depicts the Cu concentration after the heat treatment is carried out. Materials of the low permittivity layer are HSQ and Inorganic Polymer-1. For the sake of comparison, FIG. 4 describes the Cu concentration in a low permittivity layer formed of SiN (PESiN).

As illustrated in FIG. 4, the Cu concentration in the Inorganic Polymer-1 is in the $10^{19}$ atoms/cm$^3$ in a range exceeding 100 nm from the contact surface of the low permittivity layer and the Cu layer, whereas the Cu concentration in HSQ is in the $10^{18}$ atoms/cm$^3$. Cu is diffused in the range from the surface of the Inorganic Polymer-1 to approximately 100 nm, whereas Cu is diffused in the range from the contact surface of the HSQ layer and the Cu layer to approximately 50 nm. In consideration of this, as mentioned above, it is suggested that HSQ can prevent the diffusion of Cu. According to the above results, it is expressed that if the Cu concentration in the insulating film (low permittivity layer) reaches some point on the order of $10^{19}$ atoms/cm$^3$, the leakage current has some influence on the operations of the semiconductor device.

Figure 5:
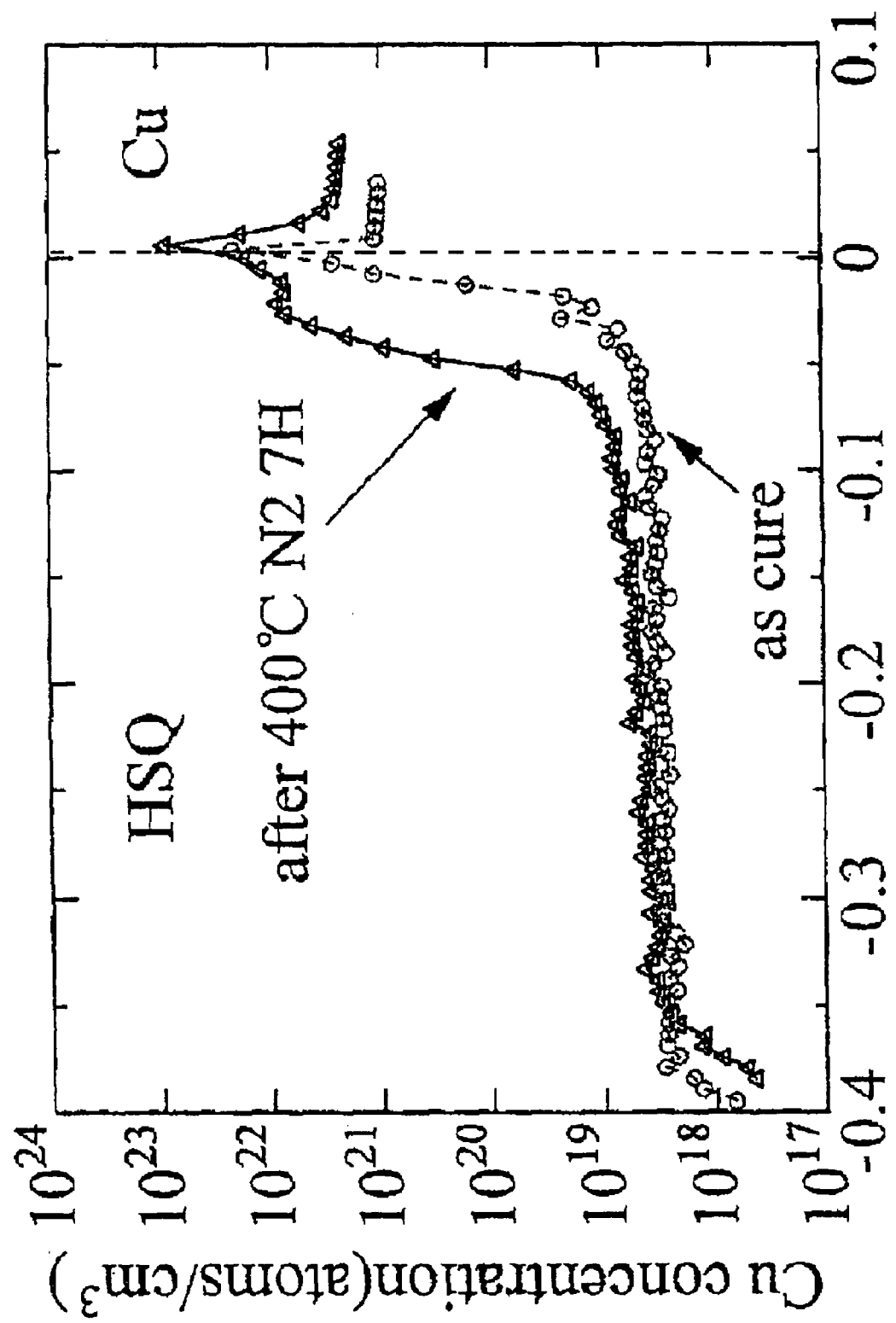
FIG. 5 is a diagram showing the concentration of Cu in an HSQ layer before and after being heat-treated.

FIG. 5 describes the Cu concentrations of an HSQ layer which is in contact with a Cu layer, respectively before and after the heat treatment. The heat treatment is performed at a temperature of 400° C. for seven hours.

In performing the heat treatment, Cu atoms in the Cu layer are diffused into the HSQ layer in a range from the surfaces of the HSQ layer and the Cu layer up to 50 nm, as described in FIG. 5. This diffusion also occurs in a parallel direction to the surfaces in a diffusion length of 50 nm.

According to the results described in FIGS. 2A to 5, it is obvious that HSQ has properties of preventing the diffusion (penetration) of Cu. Particularly, even if heat treatment, such that is to be carried out during a process of manufacturing the semiconductor devices, is performed in the state where HSQ is in contact with the Cu layer (the Cu concentration is equal to or above $10^{19}$ atoms/cm$^3$), the diffusion distance of Cu can be limited within 50 nm, and the Cu concentration of the diffused Cu can be limited to equal to or below $10^{18}$ atoms/cm$^3$.

Accordingly, having formed an interlayer insulating film using HSQ, the Cu concentration of the Cu wiring line can be set at or higher than $10^{19}$ atoms/cm$^3$. In other words, a reduction in the wiring resistance and the improvement in the operational speed of the semiconductor device can be realized, while retaining the proper operations of the semiconductor device.

A method of manufacturing the semiconductor device described in FIG. 1 will now be explained.

Figure 6A:
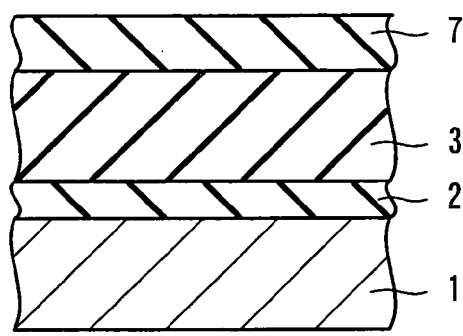
FIGS. 6A to 6P are cross sections each showing a process of manufacturing the semiconductor device illustrated in FIG. 1.
Figure 6B:
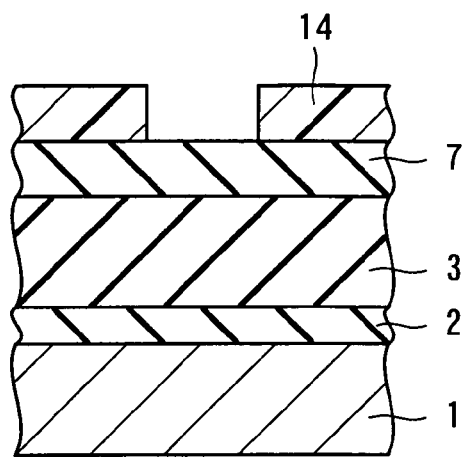
Figure 6C:
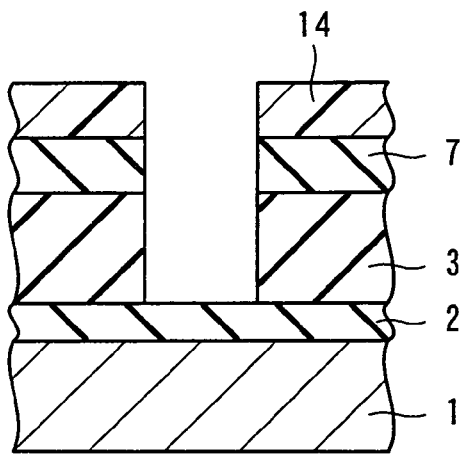
Figure 6D:
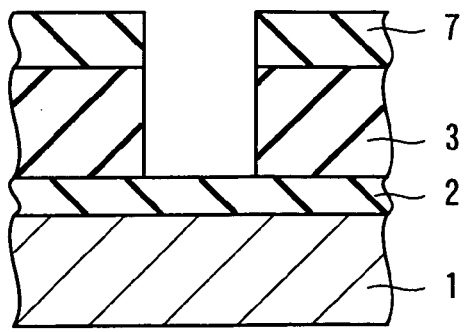
Figure 6E:
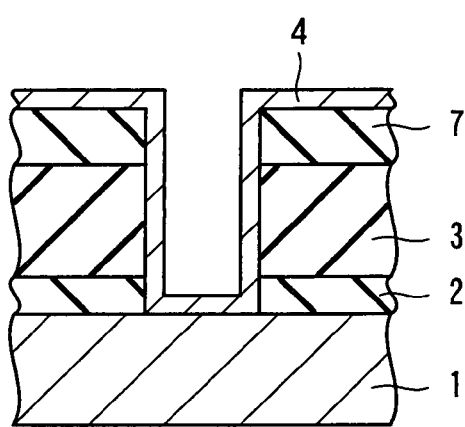
Figure 6F:
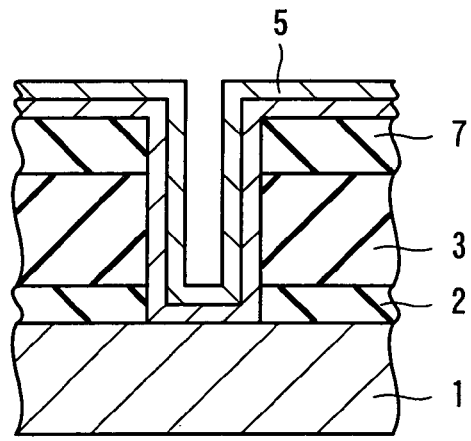
Figure 6G:
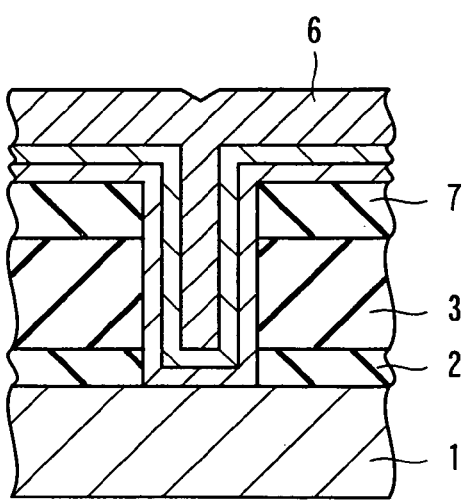
Figure 6H:
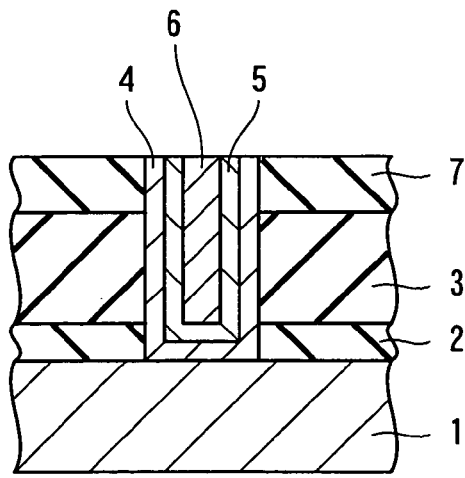
Figure 6I:
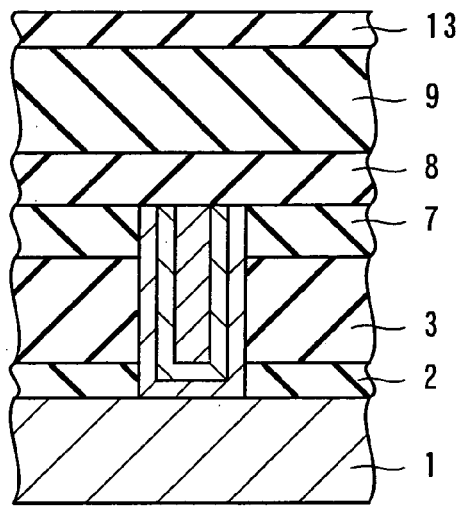
Figure 6J:
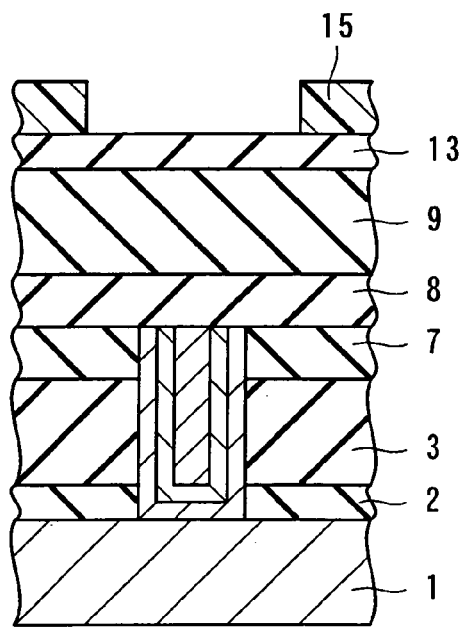
Figure 6K:
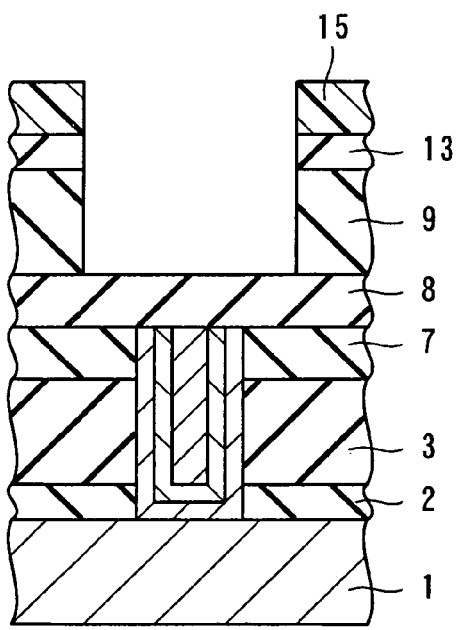
Figure 6L:
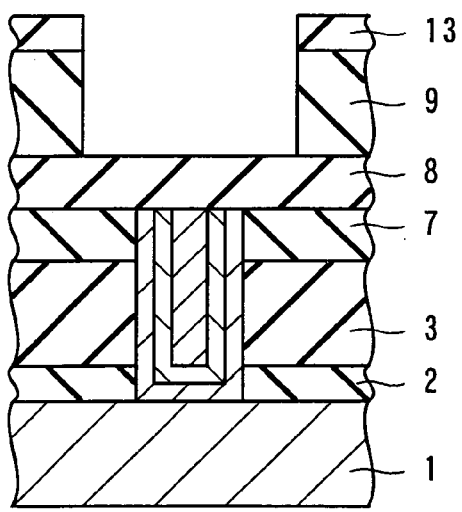
Figure 6M:
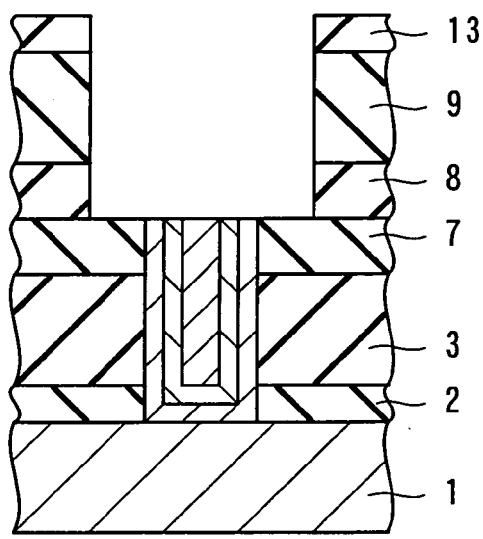
Figure 6N:
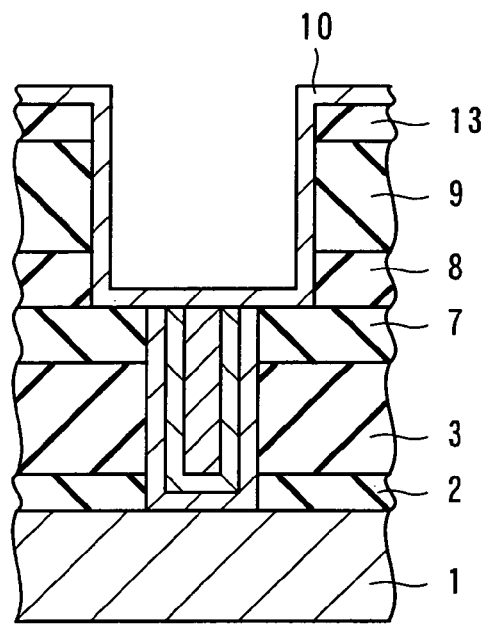
Figure 6O:
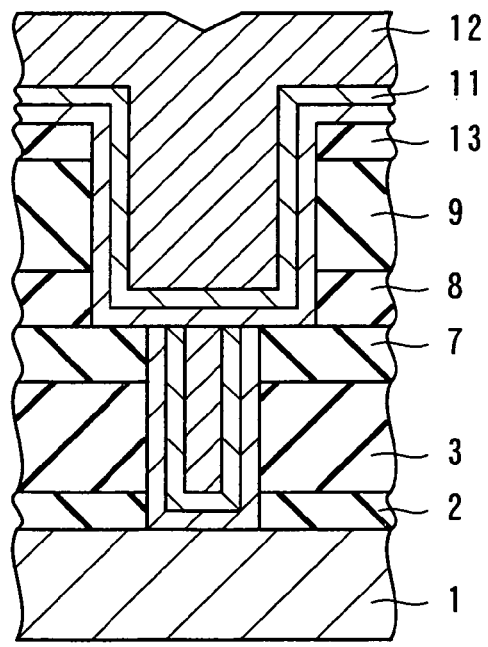
Figure 6P:
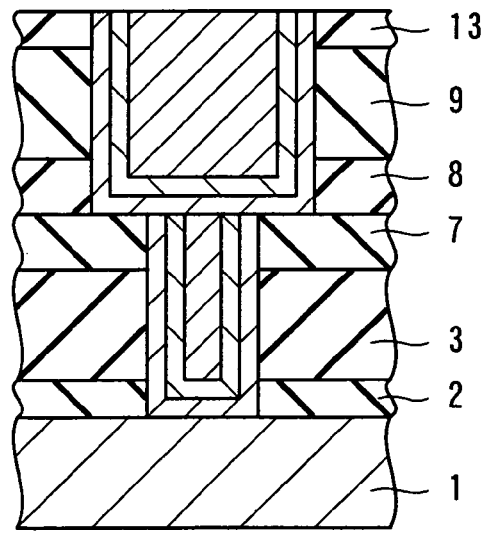

FIGS. 6A to 6P are cross sections each showing a manufacturing process of manufacturing the semiconductor device shown in FIG. 1.

As shown in FIG. 6A, the SiN layer 2 which is 50 nm in thickness is formed on the Cu wiring line 1, using, for example, a CVD (Chemical Vapor Deposition) technique.

Subsequently, HSQ is applied to the SiN layer 2 to a thickness of approximately 400 nm, and baked thereon. In doing so, the HSQ layer 3 is formed on the SiN layer 2, as illustrated in FIG. 6A.

Thereafter, as described in FIG. 6A, the SiN layer 7 which is 100 nm in thickness is formed on the HSQ layer 3 using, for example, the CVD technique.

Then, a photoresist 14 is formed on the SiN layer 7, and patterned as described in FIG. 6B. Having performed this patterning, a part of the photoresist 14 which corresponds to an area where the plug (the seed layer 5 and the plated layer 6) is formed is removed therefrom.

While the patterned photoresist 14 serves as a mask, the SiN layer 7 and the HSQ layer 3 are etched as described in FIG. 6C.

Thereafter, as illustrated in FIG. 6D, the photoresist 14 is ashed with an O$_2$ plasma etching process. In this case, if Cu is exposed to oxygen, it is oxidized. Thus, the ashing of the photoresist 14 is performed in a state where Cu is not to be exposed thereto.

Then, having further etched the SiN layers 2 and 7, a via hole is formed. As shown in FIG. 6E, the W layer 4 which is 20 nm in thickness is formed on the inner surface of the via hole and on the surface of the SiN layer 7 with an ionization sputtering technique, for example.

Subsequently, as illustrated in FIG. 6F, the seed layer 5 which is 100 nm in thickness is formed on the W layer 4 with an ionization sputtering technique, for example.

As described in FIG. 6G, the plated layer 6 which is 800 nm in thickness is plated and formed on the seed layer 5, so that the inside of the seed layer 5 is filled with the plated layer 6.

Thereafter, as illustrated in FIG. 6H, the W layer 4, the seed layer 5 and the plated layer 6 are polished until the surface of the SiN layer 7 is exposed, with a CMP (Chemical Mechanical Polishing) technique. By doing this, the plug composed of the seed layer 5 and the plated layer 6 is formed. At this time, there is only a slight difference between the polishing rate of tungsten and the polishing rate of copper, thus no dishing or recess is to be formed in the plated layer 6 using the CMP technique.

As illustrated in FIG. 6I, the SiN layer 8 which is 50 nm in thickness is formed on the SiN layer 7 with the CVD technique.

Subsequently, HSQ is applied to the SiN layer 8 to a thickness of approximately 400 nm, and baked thereon. In doing so, the HSQ layer 9 is formed on the SiN layer 8, as described in FIG. 6I.

As described in FIG. 6I, the SiN layer 13 which is 100 nm in thickness is formed on the HSQ layer 9 with, for example, the CVD technique.

Then, the photoresist 15 is formed on the SiN layer 13, and patterned as described in FIG. 6J. Having thus patterned the photoresist 15, a part of the photoresist 15 which corresponds to an area where a Cu wiring line (the seed layer 11 and the plated layer 12) is to be formed is removed therefrom.

The SiN layer 13 and the HSQ layer 9 are etched while using the patterned photoresist 15 as a mask, as described in FIG. 6K.

Thereafter, ashing of the photoresist 15 is performed with an O$_2$ plasma etching process, as illustrated in FIG. 6L. At this time, if Cu is exposed to oxygen, it is oxidized. Thus, such ashing is performed in a state where Cu is not exposed thereto.

As described in FIG. 6M, the SiN layers 8 and 13 are further etched so as to form an opening. Then, the W layer 10 which is 20 nm in thickness is formed using, for example, an ionization sputtering technique on the inner surface of the opening and on the upper surface of the SiN layer 13, as illustrated in FIG. 6N.

As described in FIG. 6O, the seed layer 11 which is 100 nm in thickness is formed on the W layer 10 using, for example, an ionization sputtering technique.

As described in FIG. 6O, the plated layer 12 which is 800 nm in thickness is plated and formed on the seed layer 11, resulting in filling the inside of the seed layer 11 with the plated layer 12.

After this, as shown in FIG. 6P, the W layer 10, the seed layer 11 and the plated layer 12 are polished until the surface of the SiN layer 13 is exposed, using a CMP (Chemical Mechanical Polishing) technique. Accordingly, the Cu wiring line including the seed layer 11 and the plated layer 12 is formed. At this time, there is only a slight difference the polishing rate of tungsten and the polishing rate of copper, thus no dishing or recess, etc. is to be formed in the plated layer 12 using the CMP technique.

Accordingly, the semiconductor device described in FIG. 1 can be completely formed.

As explained above, the interlayer insulating films included in the semiconductor device described in FIG. 1 have low permittivity and properties that Cu is unlikely to enter the films. In this structure, even if there is no barrier metal, the diffusion of Cu can be prevented. As a result of this, there is almost no possibility that a to-be-manufactured semiconductor device inappropriately operates under the influence of Cu.

A semiconductor device according to the second embodiment of the present invention will now be explained with reference to the drawings.

Figure 7:
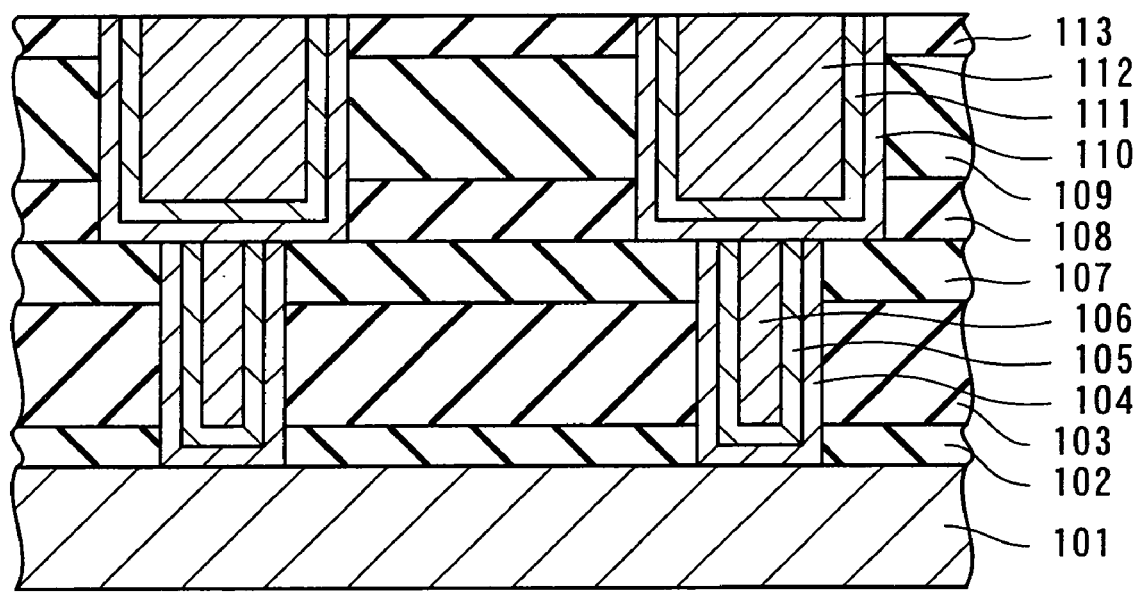
FIG. 7 is a cross section showing the structure of a semiconductor device according to the second embodiment.

FIG. 7 is a cross section showing the structure of the semiconductor device according to the second embodiment of the present invention.

As illustrated in FIG. 7, the semiconductor device comprises a Cu wiring line 101, an HSQ layer 102, a PAE (Poly Arylene Ether) layer 103, a TaN layer 104, a seed layer 105, a plated layer 106, an HSQ layer 107, an HSQ layer 108, a PAE layer 109, a TaN layer 110, a seed layer 111, a plated layer 112 and an HSQ layer 113.

The HSQ layer 102, the PAE layer 103, the HSQ layer 107, the HSQ layer 108, the PAE layer 109 and the HSQ layer 113 are formed on the Cu wiring line 101 sequentially in this order.

The HSQ layer 102 and the HSQ layer 107 are formed in such a way the PAE layer 103 serving as an interlayer insulating film is sandwiched therebetween. The HSQ layer 108 and the HSQ layer 113 are formed in such a way that the PAE layer 109 serving as an interlayer insulating film is sandwiched therebetween. The PAE layers 103 and 109 have low permittivity (particularly, approximately 2.5). As described in the first embodiment, the HSQ layers 102, 107, 108 and 113 have properties that Cu is unlikely to enter those layers. In this structure, even if Cu enters the PAE layers 103 and 109, Cu stays inside the PAE layers 103 and 109.

The TaN layer 104 is a barrier metal for preventing Cu from entering the PAE layer 103, and is formed on the inner surface of a via hole formed throughout the HSQ layer 102, the PAE layer 103 and the HSQ layer 107.

The seed layer 105 is formed over the TaN layer 104. The seed layer 105 is formed of Cu, and is a layer which servers as nuclei of crystallization for the plated layer 106 to grow, when to form the plated layer 106 with a plating.

The plated layer 106 is formed on the seed layer 105, so that the inside of the seed layer 105 is filled with the plated layer 106. The plated layer 106 is formed of Cu, and serves as a plug together with the seed layer 105.

The TaN layer 110 is a barrier metal for preventing Cu from entering the PAE layer 109, and is formed on the inner surface of the opening formed throughout the HSQ layer 108, the PAE layer 109 and the HSQ layer 113.

The seed layer 111 is formed over the TaN layer 110. The seed layer 111 is formed of Cu, and is a layer which servers as nuclei of crystallization for the plated layer 112 to grow, when to form the plated layer 112 with plating.

The plated layer 112 is formed on the seed layer 111, so that the seed layer 111 is filled with the plated layer 112. The plated layer 112 is formed of Cu, and serves as a Cu wiring line together with the seed layer 111. This Cu wiring line is an upper-layer wiring line, and is connected to the Cu wiring line 101 which is a lower-layer wiring line via the plug which is composed of the seed layer 105 and the plated layer 106. The minimum interval between the adjacent Cu wiring lines is approximately in a range from 0.2 to 0.3 μm.

The so-far described HSQ layers 102, 107, 108 and 113 are employed in place of the SiN layers 2, 7, 8 and 13 described in the first embodiment. The HSQ layer has lower permittivity than the permittivity of the SiN layer (the permittivity of the HSQ layer is 3, whereas the permittivity of the SiN layer is 7 to 8). Therefore, in the case where the permittivity of the HSQ layer and the permittivity of the PAE layer are the same, the capacity between the upper-layer wiring line and the lower-layer wiring line is smaller in the semiconductor device according to the second embodiment than that in the semiconductor device according to the first embodiment.

A method of manufacturing the semiconductor device described in FIG. 7 will now be explained.

FIGS. 8A to 10Q are cross sections each showing a process for manufacturing the semiconductor device illustrated in FIG. 7.

HSQ is applied to the Cu wiring line 101 to a thickness of approximately 100 nm, and baked thereon. By doing this, as described in FIG. 8A, the HSQ layer 102 is formed on the Cu wiring line 101.

Subsequently, PAE is applied to the HSQ layer 102 to a thickness of approximately 400 nm, and baked thereon. By doing this, as described in FIG. 8A, the PAE layer 103 is formed on the HSQ layer 102.

Further, HSQ is applied to the PAE layer 103 to a thickness of approximately 150 nm, and baked thereon. By doing this, as described in FIG. 8A, the HSQ layer 107 is formed on the PAE layer 103.

Figure 8A:
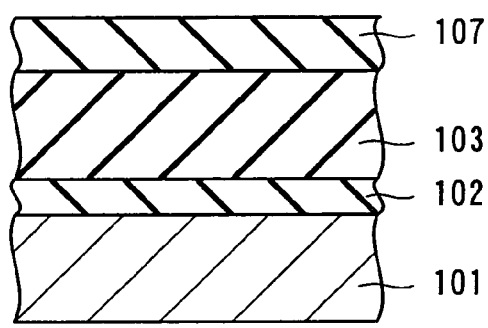
FIGS. 8A to 8P are cross sections each showing a manufacturing process of manufacturing the semiconductor device illustrated in FIG. 7.
Figure 8B:
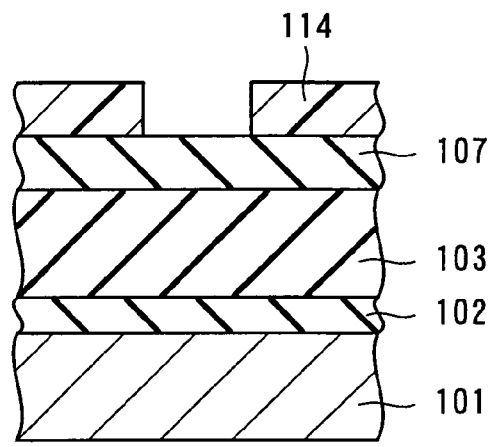

Then, a photoresist 114 is formed on the HSQ layer 107, and patterned as described in FIG. 8B. In particular, having patterned the photoresist 114, a part of the photoresist 114 which corresponds to an area where the plug (the seed layer 105 and the plated layer 106) is formed is removed therefrom.

Figure 8C:
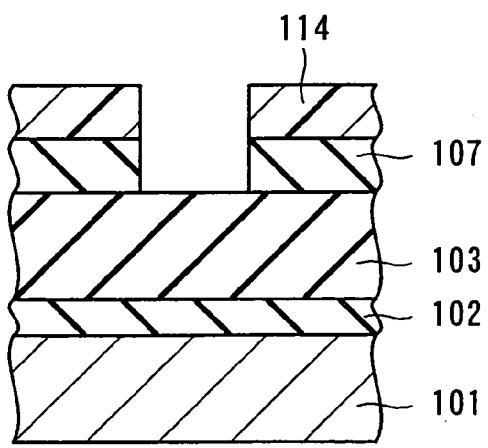

The HSQ layer 107 is etched while using the patterned photoresist 114 as a mask, as described in FIG. 8C.

Figure 8D:
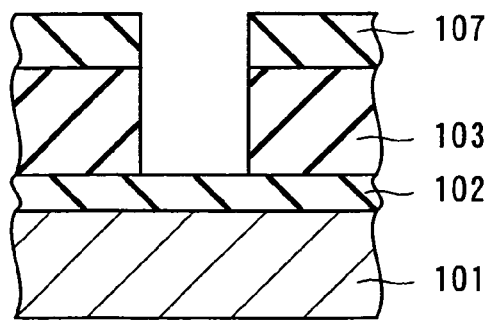

The photoresist 114 and the PAE layer 103 are removed while being etched using an $O_2$ gas, as illustrated in FIG. 8D. In this case, the HSQ layer 102 is used as an etching stopper layer.

Figure 8E:
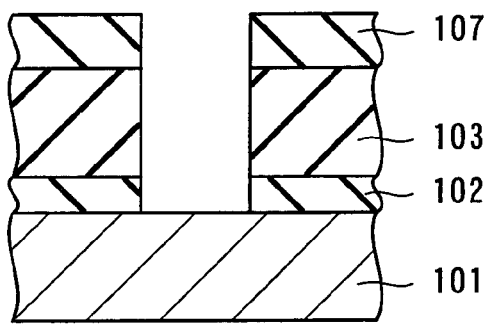

After this, the HSQ layers 102 and 107 are further etched, and the Cu wiring line 101 is exposed as described in FIG. 8E. By doing this, a via hole is formed throughout the HSQ layer 102, the PAE layer 103 and the HSQ layer 107.

Figure 8F:
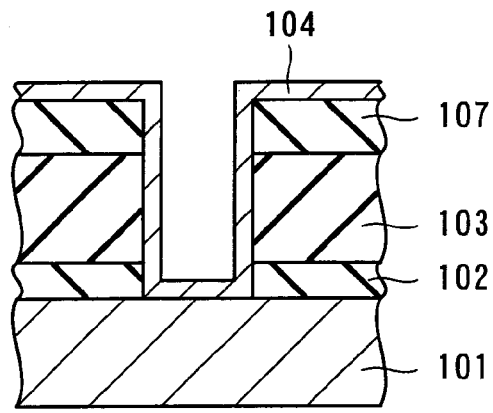

Then, the TaN layer 104 which is approximately 20 nm in thickness is formed on the inner surface of the via hole and on the surface of the HSQ layer 107 with, for example, an ionization sputtering technique, as illustrated in FIG. 8F.

Figure 8G:
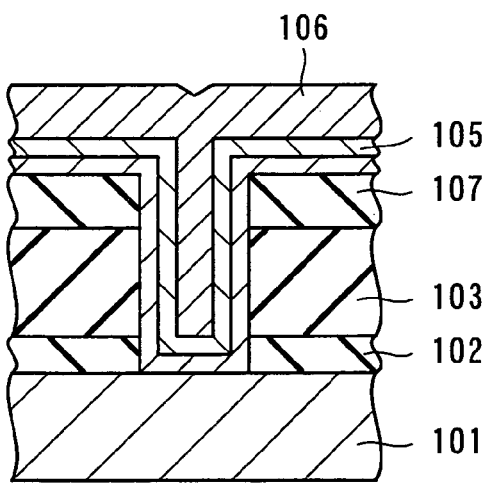

As described in FIG. 8G, the seed layer 105 which is 30 nm in thickness is formed over the TaN layer 104 with the ionization sputtering technique.

As described in FIG. 8G, the plated layer 106 which is 800 nm in thickness is formed over the seed layer 105, so that the inside of the seed layer 105 is filled with the plated layer 106.

Figure 8H:
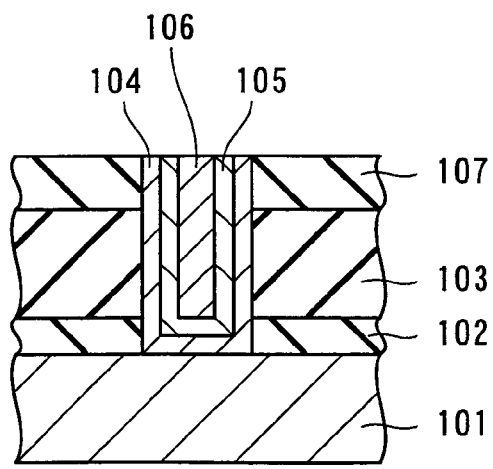

Thereafter, as illustrated in FIG. 8H, the TaN layer 104, the seed layer 105 and the plated layer 106 are so polished as to expose the surface of the HSQ layer 107, with a CMP technique. Having performed this process, the plug including the seed layer 105 and the plated layer 106 is formed.

Figure 8I:
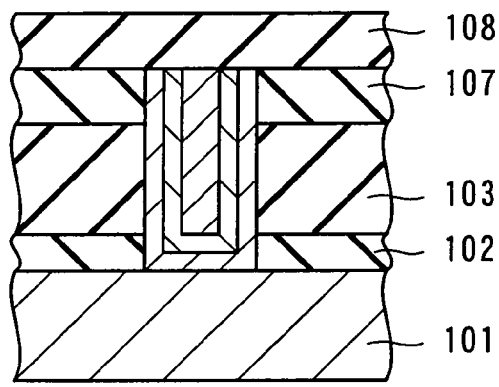

Then, HSQ is applied to the HSQ layer 107 to a thickness of approximately 100 nm, and baked thereon. Then, as illustrated in FIG. 8I, the HSQ layer 108 is formed on the HSQ layer 107.

Figure 8J:
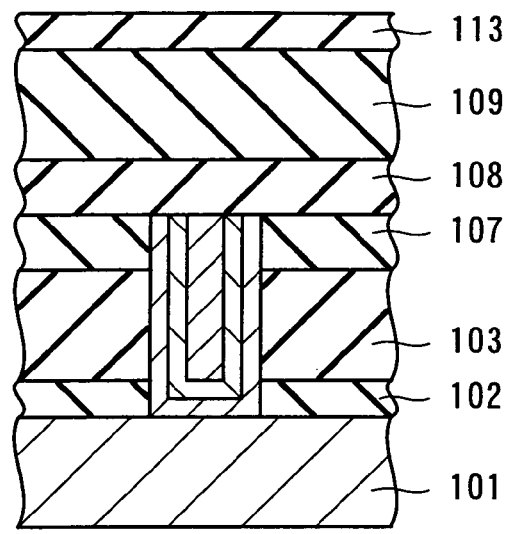

Subsequently, PAE is applied to the HSQ layer 108 to a thickness of approximately 400 nm, and baked thereon. By doing this, as illustrated in FIG. 8J, the PAE layer 109 is formed on the HSQ layer 108.

HSQ is applied to the PAE layer 109 to a thickness of approximately 150 nm, and baked thereon. By doing this, as illustrated in FIG. 8J, the HSQ layer 113 is formed on the PAE layer 109.

Figure 8K:
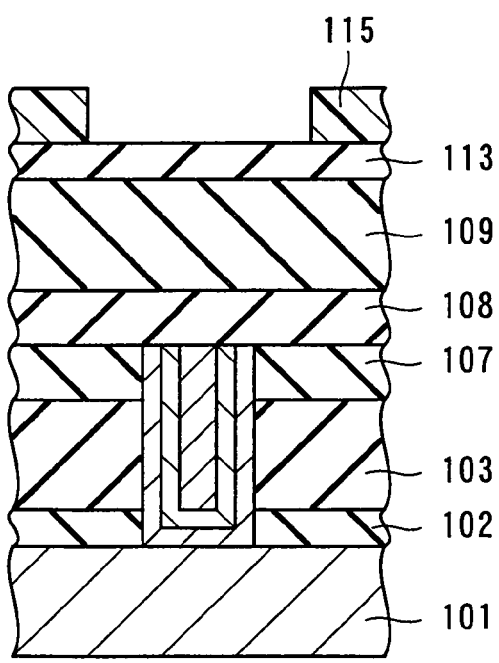

A photoresist 115 is formed on the HSQ layer 113, and patterned as described in FIG. 8K. Particularly, having patterned the photoresist 115, a part of the photoresist 115 which corresponds to an area where the Cu wiring line (including the seed layer 111 and the plated layer 112) is formed is removed therefrom.

Figure 8L:
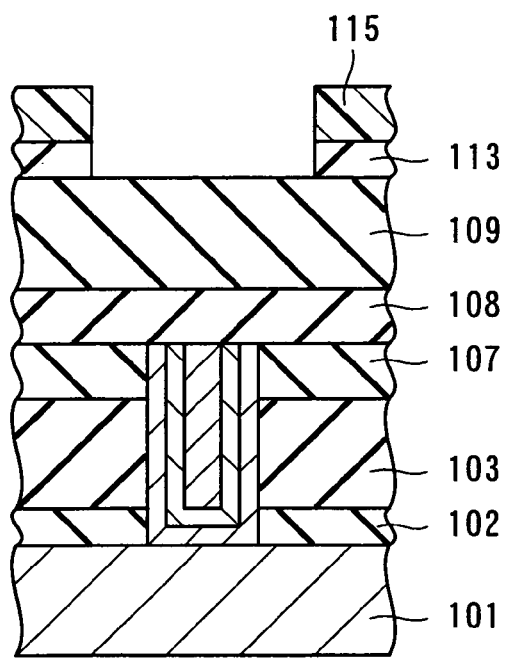

The HSQ layer 113 is etched while using the patterned photoresist 115 as a mask, as described in FIG. 8L.

Figure 8M:
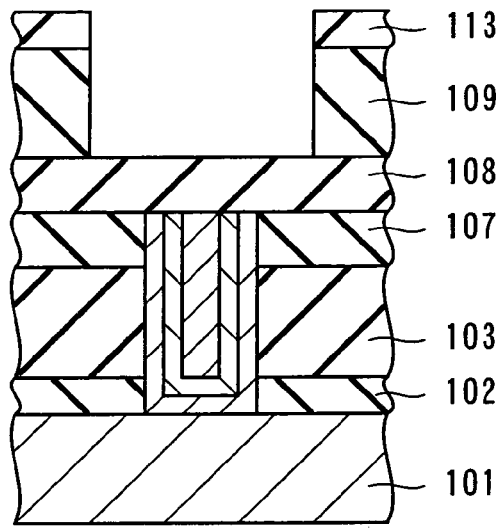

The photoresist 115 and the PAE layer 109 are removed while being etched with an $O_2$ gas, as described in FIG. 8M. In this case, the HSQ layer 108 is used as an etching stopper layer.

Figure 8N:
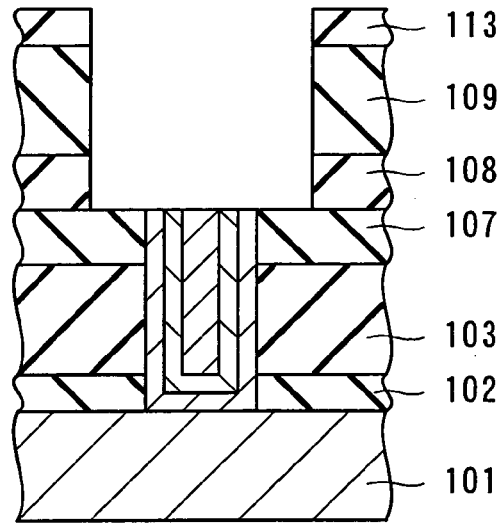

Then, the HSQ layers 108 and 113 are further etched, and as illustrated in FIG. 8N, the seed layer 105 and the plated layer 106 are exposed. By doing this, an opening is formed throughout the HSQ layer 108, the PAE layer 109 and the HSQ layer 113.

Figure 8O:
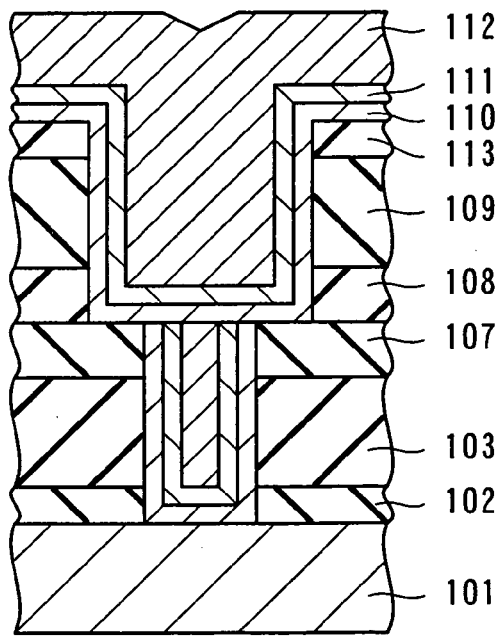

The TaN layer 110 which is 20 nm in thickness is formed on the inner surface of the opening and on the surface of the HSQ layer 113 with an ionization sputtering technique, as described in FIG. 8O.

Subsequently, as described in FIG. 8O, the seed layer 111 which is 30 nm in thickness is formed over the TaN layer 110 with an ionization sputtering technique.

As illustrated in FIG. 8O, the plated layer 112 which is 800 nm in thickness is formed over the seed layer 111 while being plated, thereby to fill the inside of the seed layer 111 with the plated layer 112.

Figure 8P:
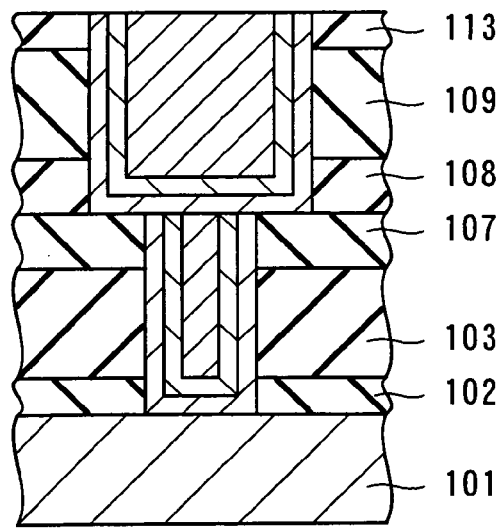
Figure 9:
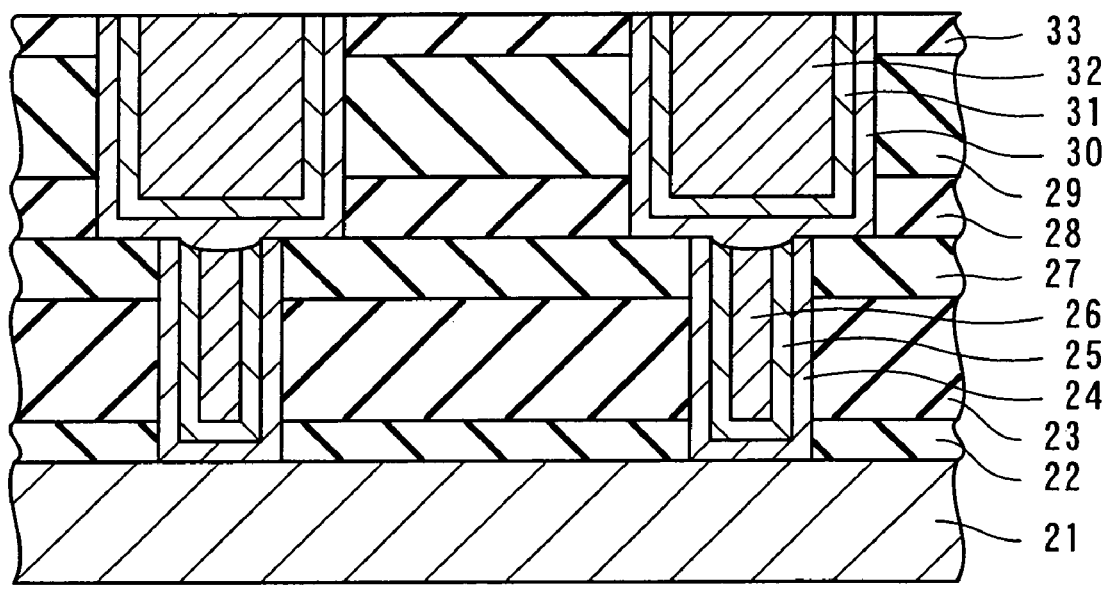
FIG. 9 is a cross section showing the structure of a conventional semiconductor device.
Figure 10A:
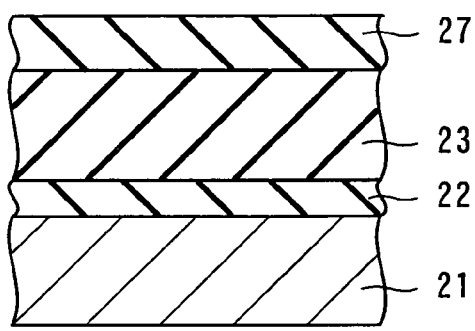
FIGS. 10A to 10H are cross sections each showing a manufacturing process of manufacturing the semiconductor device illustrated in FIG. 9.
Figure 10B:
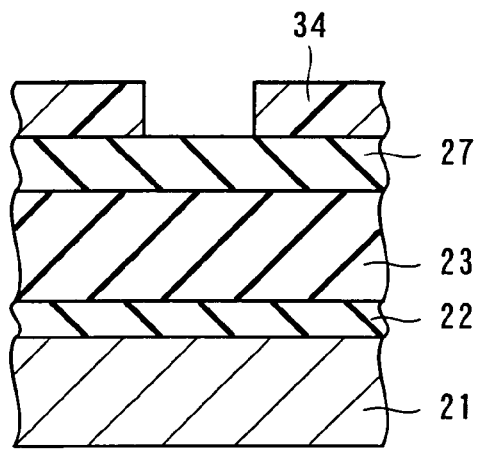
Figure 10C:
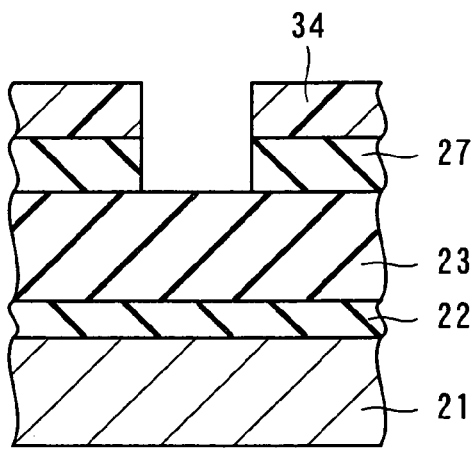
Figure 10D:
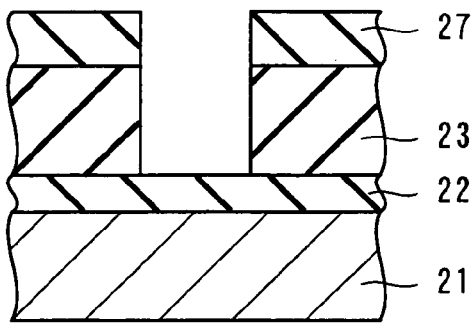
Figure 10E:
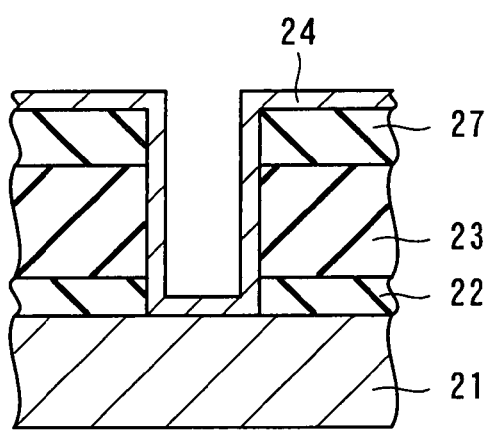
Figure 10F:
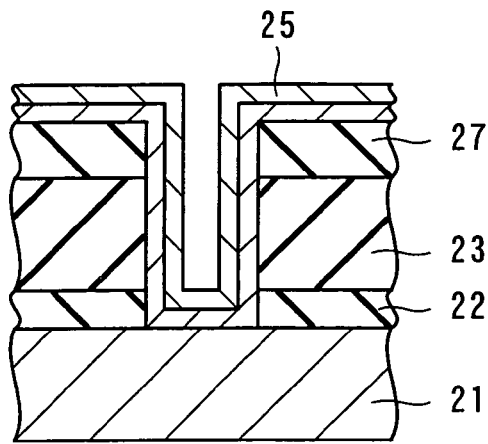
Figure 10G:
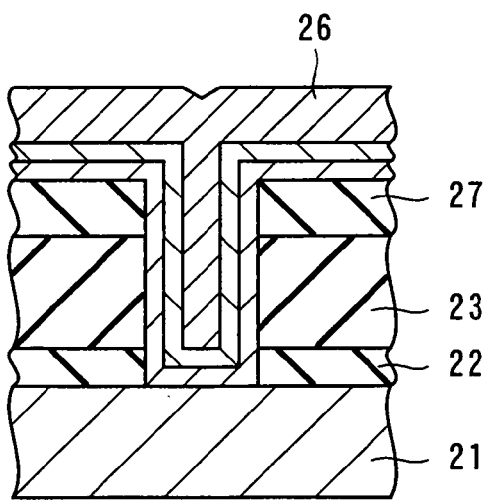
Figure 10H:
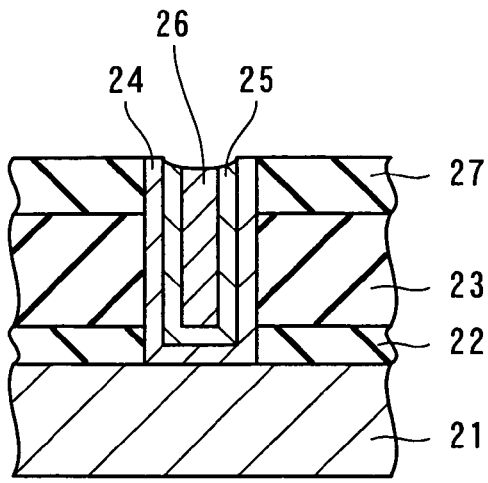
Figure 11:
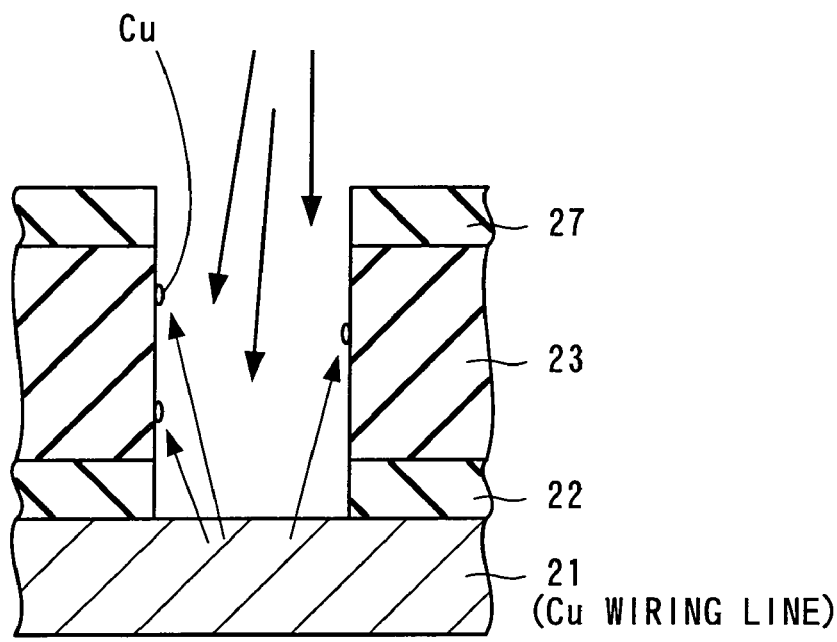
FIG. 11 is a diagram showing a process wherein Cu is attached to inner sides of a interlayer insulating film.
Figure 12:
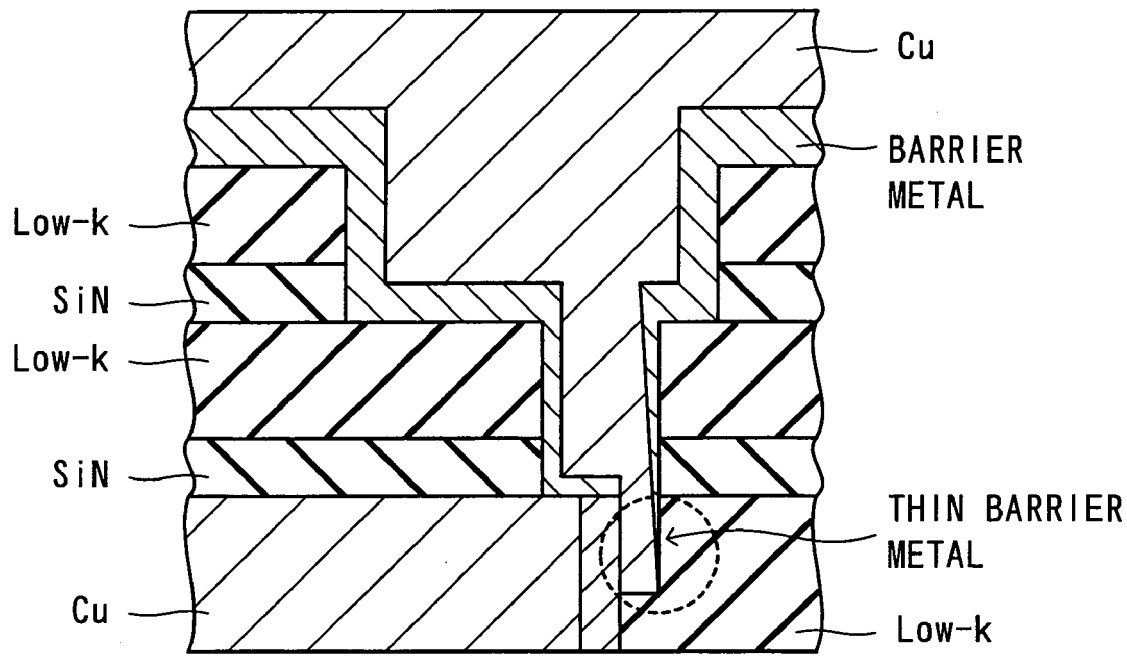
FIG. 12 is a cross section showing a semiconductor device in which diffusion of Cu can not be prevented.

Thereafter, as described in FIG. 8P, the TaN layer 110, the seed layer 111 and the plated layer 112 are so polished as to expose the surface of the HSQ layer 113 with the CMP technique. By doing this, the Cu wiring line comprising the seed layer 111 and the plated layer 112 can be formed.

Accordingly, the semiconductor device described in FIG. 7 can completely be formed.

As explained above, barrier metals are respectively formed between the interlayer insulating films and the seed layers forming the semiconductor device illustrated in FIG. 7, and the interlayer insulating films included in the semiconductor device described in FIG. 7 are respectively sandwiched by the HSQ layers having low permittivity and properties that Cu is unlikely to enter the HSQ layers. In this structure, the diffusion of Cu can surely be prevented. As a result, there is almost no possibility that a to-be-manufactured semiconductor device inappropriately operates under the influence of Cu.

In the first and second embodiments, the explanations have been made to one example of the semiconductor device having the single damascene structure, for the sake of easy understanding. However, the semiconductor device may have the dual damascene structure.

In the first and second embodiments, the explanations have been made to the semiconductor device having the two-layer structure, however, the present invention is applicable to the semiconductor device having the multi-layer structure. In the first embodiment, in place of the SiN layers 2, 7, 8 and 13, SiC layers formed of SiC or $SiO_2$ layers formed of $SiO_2$ may be used.

The semiconductor device described in the first embodiment may not include the W layers 4 and 10, because the HSQ layers 3 and 9 have the properties that Cu is prevented from being diffused.

As long as the interlayer insulating films have the low permittivity and the properties that Cu is unlikely to enter the layers, the films may be formed of any elements other than HSQ.

Various embodiments and changes may be made thereonto without departing from the broad spirit and scope of the invention. The above-described embodiments are intended to illustrate the present invention, not to limit the scope of the present invention. The scope of the present invention is shown by the attached claims rather than the embodiment. Various modifications made within the meaning of an equivalent of the claims of the invention and within the claims are to be regarded to be in the scope of the present invention.

This application is based on Japanese Patent Application No. H11-217085 filed on Jul. 30, 1999, and including specification, claims, drawings and summary. The disclosure of the above Japanese Patent Application is incorporated herein by reference in its entirety.

What is claimed is:

1. A semiconductor device, comprising:
   a first interlayer insulating layer;
   a plurality of wiring lines which are formed of copper (Cu), said plurality of wiring lines formed on said first interlayer insulating layer, at least two of said wiring lines being separated from each other by at least a distance predetermined to approach a value, approximately 0.2 to 0.3 μm, for which atoms of said Cu will be unlikely to diffuse through an insulator between said wiring lines in a quantity sufficient to allow a breakdown in an electrical insulation between said wiring lines;
   a first insulating layer which has a property that Cu atoms diffuse into said insulating layer in accordance with a diffusion gradient but is unlikely to enter said insulating layer beyond said predetermined distance, which said predetermined distance thereby effectively insulates between said plurality of wiring lines; and
   a second interlayer insulating layer formed on said first insulating layer having the property that the Cu is unlikely to enter therein,
   wherein said diffusion gradient of said first insulating layer has a surface region whose Cu concentration is equal to or higher than $10^{19}$ atoms/cm$^3$ and approaches no more than an order of magnitude of $10^{18}$ atoms/cm$^3$ within one-half of said predetermined distance.

2. The semiconductor device according to claim 1, wherein said insulating layer has an inner region whose Cu concentration is lower than $10^{19}$ atoms/cm$^3$, in acccordance with said diffusion gradient.

3. The semiconductor device according to claim 2, wherein said insulating layer comprises Hydrogen Silsesquioxane (HSQ).

4. The semiconductor device according to claim 3, wherein a thickness of said insulating layer comprising HSQ is equal to or more than 50 nm.

5. A semiconductor device, comprising:
   a plurality of copper (Cu) wiring lines; and
   an insulating layer which insulates between said plurality of Cu wiring lines,
   wherein:
      said insulating layer has a surface region respectively adjacent to said wiring lines whose Cu concentration is equal to or higher than $10^{19}$ atoms/cm$^3$ due to a diffusion of Cu from said Cu wiring lines, said concentration decreasing radially outward from said surface region in an inner region in accordance with a diffusion gradient to between $10^{19}$ and $10^{18}$ atoms/cm$^3$, and
      a separation distance between at least two of said Cu wiring lines approaches a minimum consistent with maintaining a region therebetween that has a concentration of said diffused Cu that is no greater than an order of magnitude of $10^{18}$ atoms/cm$^3$.

6. The semiconductor device according to claim 5, wherein said insulating layer comprises Hydrogen Silsesquioxane (HSQ).

7. The semiconductor device according to claim 6, wherein a thickness of said insulating layer comprising HSQ is equal to or more than approximately 50 nm.

8. The semiconductor device according to claim 7, wherein said inner region of said insulating layer is an inner region of a position which is 50 nm or more from a surface of said insulating layer.

9. The semiconductor device according to claim 8, wherein said insulating layer directly contacts Cu.

10. The semiconductor device according to claim 5, further comprising:
    a first interlayer insulating layer formed below said insulating layer; and
    a second interlayer insulating layer formed on said insulating layer,
    wherein said first and second interlayer insulating layers have a property in strength that offsets a property in strength of said insulating layer.

11. The semiconductor device according to claim 10, wherein said first and second interlayer insulating layers each comprise SiN, and said insulating layer comprises HSQ (Hydrogen Silsesquioxane).

12. The semiconductor device according to claim 11, further comprising:
    a bottom layer formed below said first interlayer insulating layer, said bottom layer having at least one copper conductor line, wherein said first interlayer insulating layer has a hole formed therein, said hole allowing at least one copper conductor line in said bottom layer to connect with one of said plurality of said copper wiring lines.

13. The semiconductor device according to claim 12, further comprising:
    a layer of adhesive material formed at an interface between said insulating layer and each of said plurality of copper wiring lines.

14. The semiconductor device according to claim 13, wherein said adhesive material comprises tungsten (W).

15. The semiconductor device according to claim 11, wherein said third and fourth interlayer insulating layers each comprise SiN, and said another insulating layer comprises HSQ (Hydrogen Silsesquioxane).

16. The semiconductor device of claim 10, further comprising:
    a third interlayer insulating layer formed on said insulating layer;
    another insulating layer formed on said third interlayer insulating layer, said another insulating layer having a property that Cu is unlikely to enter said another insulting layer;
    a second plurality of copper wiring lines formed in said another insulating layer; and
    a fourth interlayer insulating layer formed on said another insulating layer.

17. The semiconductor device according to claim 16, further comprising:
    a layer of adhesive material formed at an interface between said another insulating layer and each of said second plurality of copper wiring lines.

18. The semiconductor device according to claim 17, wherein said adhesive material comprises tungsten (W).

19. The semiconductor device according to claim 16, wherein said third interlayer insulating layer has a hole formed therein, said hole allowing at least one of said copper wiring lines in said insulating layer to connect with one of said second plurality of said copper wiring lines.

20. The semiconductor device according to clam 5, wherein:
    said insulating layer comprises a first interlayer insulating layer, a middle insulating layer, and a second insulating layer,
    said first interlayer insulating layer comprises a first material,
    said middle insulating layer is formed on said first interlayer insulating layer and comprises an organic polymer,
    said second insulating layer is formed on said middle insulating layer and comprises said first material, and
    said first interlayer insulating layer, said middle insulating layer, and said second insulating layer form a system that serves to confine a migration of copper ions from said copper wiring lines to be within said middle insulating layer.

21. The semiconductor device of claim 20, wherein said first material comprises SiN, and said middle insulating layer comprises hydrogen silsesquioxane (HSQ), said HSQ having a property that a migration of copper ions is limited therein.

22. The semiconductor device of claim 20, wherein said first material comprises hydrogen silsesquioxane (HSQ) and said middle insulating layer comprises Poly Arylene Ether (PAE), said HSQ having a property that a migration of copper ions is limited therein, so that said first interlayer insulating layer thereby provides a lower layer to confine said migration of copper ions and said second interlayer insulating layer thereby provides an upper layer to confine said migration of copper ions.

23. A semiconductor device, comprising:
    a plurality of copper (Cu) wiring lines; and
    an insulating layer which insulates between said plurality of Cu wiring lines,
    wherein:
    said insulating layer has a surface region whose Cu concentration is equal to or higher than $10^{19}$ atoms/cm$^3$,
    said insulating layer comprises a multi-layer insulating layer which comprises a middle layer comprised of PAE (Poly Arylene Ether) and an upper insulating layer and a lower insulating layer between which said middle layer is sandwiched, said upper and lower insulating layers each being comprised of HSQ (Hydrogen Silsesquioxane),
    openings are formed in predetermined positions in said PAE layer and said HSQ layers, and one of said plurality of said Cu wiring lines is respectively formed in one of said openings, and
    said Cu wiring lines comprise Cu having a concentration equal to or higher than $10^{19}$ atoms/cm$^3$, said upper insulating layer and said lower insulating layer thereby forming an insulating layer which has a property that Cu is unlikely to enter said upper and lower insulating layers.

24. A semiconductor device, comprising:
    a first interlayer insulating layer;
    a plurality of wiring lines which are formed of copper (CU), said plurality of wiring lines formed on said first interlayer insulating layer;

a second insulating layer which has a property that Cu diffuses into said second insulating layer at a concentration of approximately $10^{19}$ atoms/cm$^3$ in a first region adjacent to each said wiring line, said concentration decreasing in accordance with a diffusion gradient in a second region down to between $10^{18}$ atoms/cm$^3$ and $10^{19}$ atoms/cm$^3$ and a third region wherein said concentration is no greater than an order of magnitude of $10^{18}$ atoms/cm$^3$ and which said third region serves to insulates between said plurality of wiring lines; and a second interlayer insulating layer formed on said second insulating layer, wherein a separation distance between at least two of said Cu wiring lines approaches a minimum for said third region.

* * * * *